(12) United States Patent
Shatalov et al.

(10) Patent No.: US 9,548,429 B2
(45) Date of Patent: Jan. 17, 2017

(54) PACKAGING FOR ULTRAVIOLET OPTOELECTRONIC DEVICE

(71) Applicant: Sensor Electronic Technology, Inc., Columbia, SC (US)

(72) Inventors: Maxim S. Shatalov, Columbia, SC (US); Saulius Smetona, Concord, NC (US); Alexander Dobrinsky, Loudonville, NY (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/708,478

(22) Filed: May 11, 2015

(65) Prior Publication Data

US 2016/0027970 A1    Jan. 28, 2016

Related U.S. Application Data

(60) Provisional application No. 61/991,464, filed on May 10, 2014, provisional application No. 62/040,817, (Continued)

(51) Int. Cl.
*H01L 33/58* (2010.01)
*H01L 33/00* (2010.01)
(Continued)

(52) U.S. Cl.
CPC ............. *H01L 33/507* (2013.01); *H01L 24/97* (2013.01); *H01L 33/0095* (2013.01);
(Continued)

(58) Field of Classification Search
None
See application file for complete search history.

(56) References Cited

U.S. PATENT DOCUMENTS

| | | | |
|---|---|---|---|
| 5,635,115 A * | 6/1997 | Konishi ................ | G02B 3/005 |
| | | | 257/E21.502 |
| 6,921,929 B2 | 7/2005 | LeBoeuf et al. | |

(Continued)

FOREIGN PATENT DOCUMENTS

| JP | 2012019062 A | 1/2012 |
|---|---|---|
| KR | 20080055549 A | 6/2008 |

(Continued)

OTHER PUBLICATIONS

Park, H., International Application No. PCT/US2015/030075, International Search Report and Written Opinion, Jul. 28, 2015, 7 pages.

(Continued)

*Primary Examiner* — Khaja Ahmad
(74) *Attorney, Agent, or Firm* — LaBatt, LLC

(57) ABSTRACT

A solution for packaging an optoelectronic device using an ultraviolet transparent polymer is provided. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment.

20 Claims, 22 Drawing Sheets

Related U.S. Application Data filed on Aug. 22, 2014, provisional application No. 62/104,380, filed on Jan. 16, 2015, provisional application No. 62/153,055, filed on Apr. 27, 2015.

(51) Int. Cl.
*H01L 33/52* (2010.01)
*H01L 33/50* (2010.01)
*H01L 23/00* (2006.01)

(52) U.S. Cl.
CPC ........ *H01L 33/501* (2013.01); *H01L 2224/14* (2013.01); *H01L 2933/005* (2013.01); *H01L 2933/0025* (2013.01); *H01L 2933/0033* (2013.01); *H01L 2933/0041* (2013.01)

(56) References Cited

U.S. PATENT DOCUMENTS

| | | |
|---|---|---|
| 2003/0230977 A1 | 12/2003 | Epstein |
| 2004/0184270 A1 | 9/2004 | Halter |
| 2005/0062412 A1* | 3/2005 | Taniguchi ............... F21K 9/135 313/512 |
| 2006/0138443 A1 | 6/2006 | Fan et al. |
| 2007/0264739 A1* | 11/2007 | Chew ..................... H01L 33/52 438/46 |
| 2011/0212334 A1* | 9/2011 | Jolley ..................... B29C 73/02 428/458 |
| 2011/0215342 A1* | 9/2011 | Oliver ..................... B29C 43/18 257/81 |
| 2013/0078411 A1 | 3/2013 | Gaska et al. |
| 2013/0119424 A1 | 5/2013 | Kang et al. |
| 2013/0119426 A1 | 5/2013 | Katoh et al. |
| 2014/0021503 A1 | 1/2014 | Yoshida et al. |

FOREIGN PATENT DOCUMENTS

| | | |
|---|---|---|
| KR | 20110034072 A | 4/2011 |
| WO | 2013006616 A1 | 1/2013 |

OTHER PUBLICATIONS

Teng, H., "Overview of the Development of the Fluoropolymer Industry," Applied Sciences, vol. 2, No. 4, pp. 496-512, May 2012.
Daikin Industries, Ltd., "Product Overview: Daikin Fluorochemical Products," http://www.daikin.co.jp/chm, pp. 1-4.
AGC Chemicals Europe, Ltd., "Fluon ETFE Film," 1 page.
AGC Chemicals Europe, Ltd., "F-Clean," 1 page.
Ahmad, K., U.S. Appl. No. 14/938,437, Non-Final Rejection, Jul. 29, 2016, 25 pages.

* cited by examiner

Cytop 200 μm
1. Standard Grade
2. High Transmittance Gr.
3. PMMA 200 μm

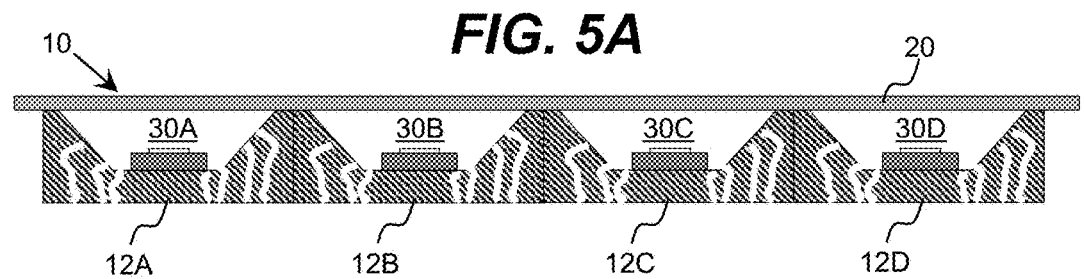
FIG. 5A
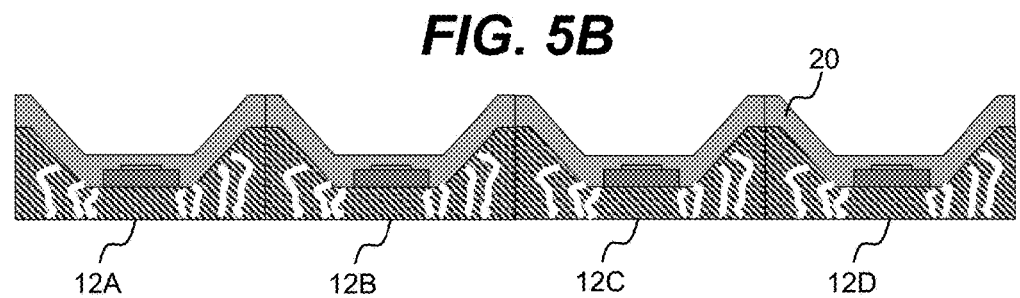
FIG. 5B
FIG. 5C
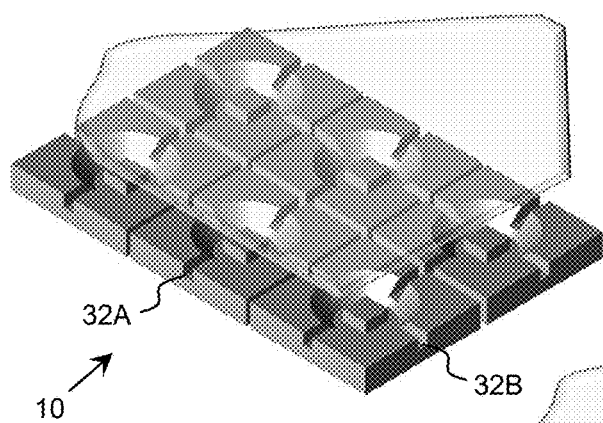
FIG. 5D
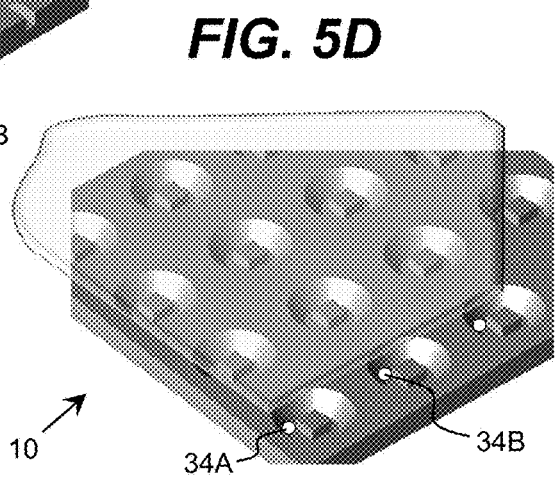

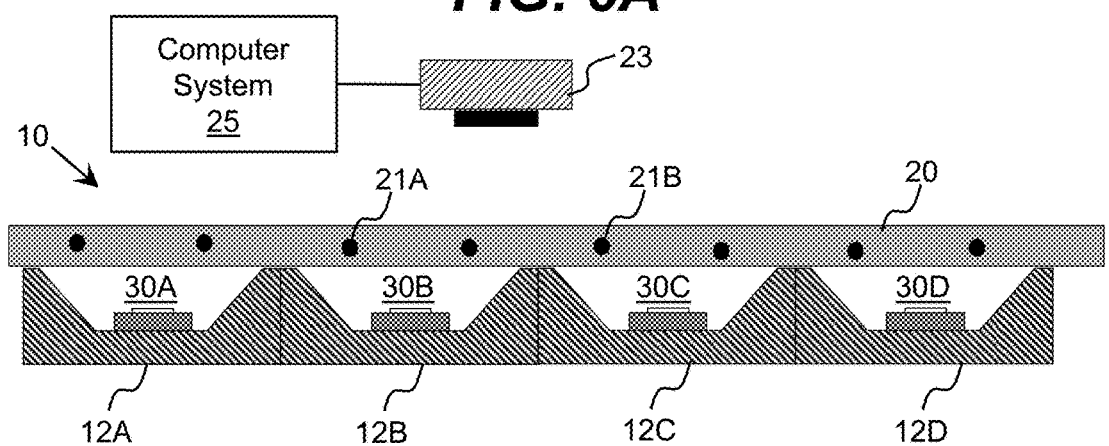
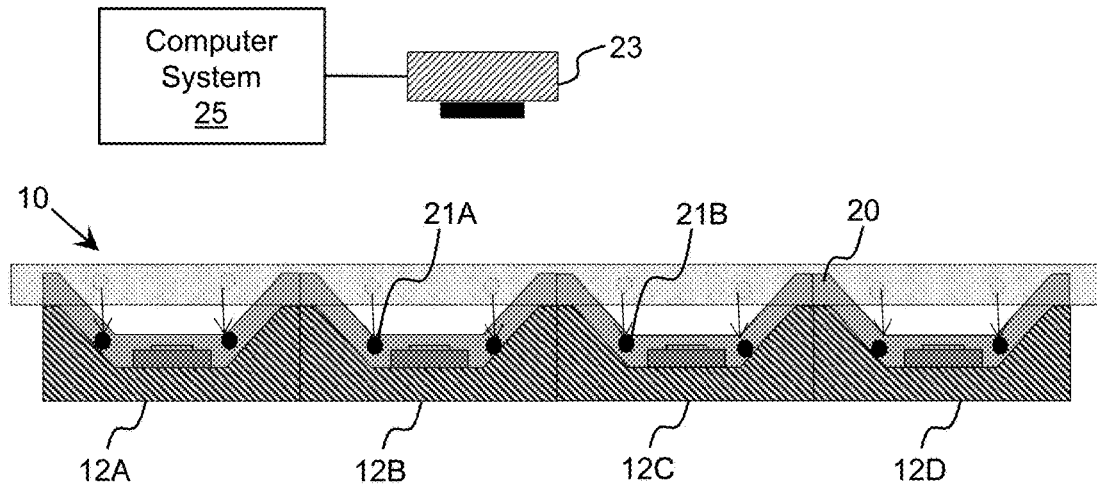

PACKAGING FOR ULTRAVIOLET OPTOELECTRONIC DEVICE

REFERENCE TO RELATED APPLICATIONS

The current application claims the benefit of: U.S. Provisional Application No. 61/991,464, which was filed on 10 May 2014; U.S. Provisional Application No. 62/040,817, which was filed on 22 Aug. 2014; U.S. Provisional Application No. 62/104,380, which was filed on 16 Jan. 2015; and U.S. Provisional Application No. 62/153,055, which was filed on 27 Apr. 2015, each of which is hereby incorporated by reference.

TECHNICAL FIELD

The disclosure relates generally to ultraviolet light emitting devices, and more particularly, to an encapsulant for ultraviolet light emitting devices.

BACKGROUND ART

Due to recent advances in group III-based ultraviolet (UV) light emitting diode (LED) technology, interest in using UV LEDs for various applications, such as disinfection of medical tools, water purification, fluorescence spectroscopy, medical therapy, and the like, is increasing. In order to successfully utilize such devices, they need to be packaged and isolated from interaction with the outside environment to protect the electrical components of these devices. In addition, packaging solutions can provide a way to improve light extraction efficiency. For example, one approach for improving light extraction uses an index matching encapsulant (e.g., similar to the approach used for visible LEDs) in order to decrease the total internal reflection (TIR) from the device surfaces and, as a result, extract more light from the UV LED.

Typical epoxy resin materials used for visible LED encapsulation are not adequate for UV LEDs as the resins are not sufficiently transparent to UV radiation and quickly deteriorate under the UV radiation. An ideal encapsulant should be "stable." In particular, the optical and physical properties of the encapsulant should not change during packaging, LED assembly, and during the operating lifetime of the LED. For example, an encapsulant should be resistant to heating during the LED assembly, such as during soldering a chip onto a printed circuit board or during a curing process. During the curing process, drying of the encapsulant can further induce stresses in the material. As a result, an encapsulant that is not prone to crack during the curing procedure can be selected.

Recently, UV transparent, and partially UV transparent fluoropolymers have become important materials for UV applications and can serve as moldable encapsulants for optoelectronic devices. For instance, one approach discloses materials and methods used to package and encapsulate UV and deep UV (DUV) LEDs having emission wavelengths from around 360 nm to around 200 nm. The UV/DUV LED die, or its flip-chip bonded subassembly, are disposed in a low thermal resistance packaging house. Either the whole package or just the UV/DUV LED is globed with a UV/DUV transparent dome-shape encapsulation. This protects the device, enhances light extraction, and focuses the light emitted. The disclosure describes dome-shape encapsulation may be comprised of optically transparent PMMA, fluorinated polymers or other organic materials. Alternatively, it might be configured to include a lens made from sapphire, fused silica, or other transparent materials. The lens material is cemented on the UV/DUV LED with UV/DUV transparent polymers.

SUMMARY OF THE INVENTION

The inventors recognize a need to improve a technique for encapsulation specific to fluoropolymers. For example, the above application discusses encapsulation using transparent polymers, but does not take into account the fact that fluoropolymers, while being moldable at about melting temperature, cannot easily fill the voids and be fluid like.

Aspects of the invention provide a solution for packaging an optoelectronic device using an ultraviolet transparent polymer. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment.

A first aspect of the invention provides a method of packaging a set of optoelectronic devices, the method comprising: obtaining a device package including the set of optoelectronic devices mounted on a first surface; placing an ultraviolet transparent polymer material adjacent to each optoelectronic device in the set of optoelectronic devices on the first surface; and processing the ultraviolet transparent polymer material to cause the transparent polymer material to adhere to at least a portion of the first surface such that the device package and the ultraviolet transparent polymer material seal a portion of each optoelectronic device in the set of optoelectronic devices located on the first surface from an ambient environment.

A second aspect of the invention provides a method of packaging an optoelectronic device, the method comprising: mounting the optoelectronic device onto a first surface of a device package; placing an ultraviolet transparent polymer film adjacent to the optoelectronic device on the first surface; and processing the ultraviolet transparent polymer film to cause the transparent polymer film to adhere to at least a portion of the first surface and at least a portion of the optoelectronic device such that the device package and the ultraviolet transparent polymer material seal a portion of the optoelectronic device from an ambient environment.

A third aspect of the invention provides a method of packaging an optoelectronic device, the method comprising: placing an ultraviolet transparent polymer film adjacent to a first surface of a device package on which an optoelectronic device is mounted; and processing the ultraviolet transparent polymer film to cause the transparent polymer film to adhere to at least a portion of the first surface and at least a portion of the optoelectronic device such that the device package and the ultraviolet transparent polymer material seal a portion of the optoelectronic device from an ambient environment, wherein the processing includes: heating the film to cause the film to become flowable; monitoring the film to determine when the film has flowed sufficiently; applying a pressure to the film and the device package after sufficient flow has occurred; and allowing the film to cure.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4A shows a transparent polymer film being applied to a structure, while

FIGS. 5A-5D illustrate a packaging processes in which the transparent polymer film is molded to a shape of the top surface of the device packages according to embodiments.

FIGS. 6A and 6B show another embodiment of packaging a set of device packages according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
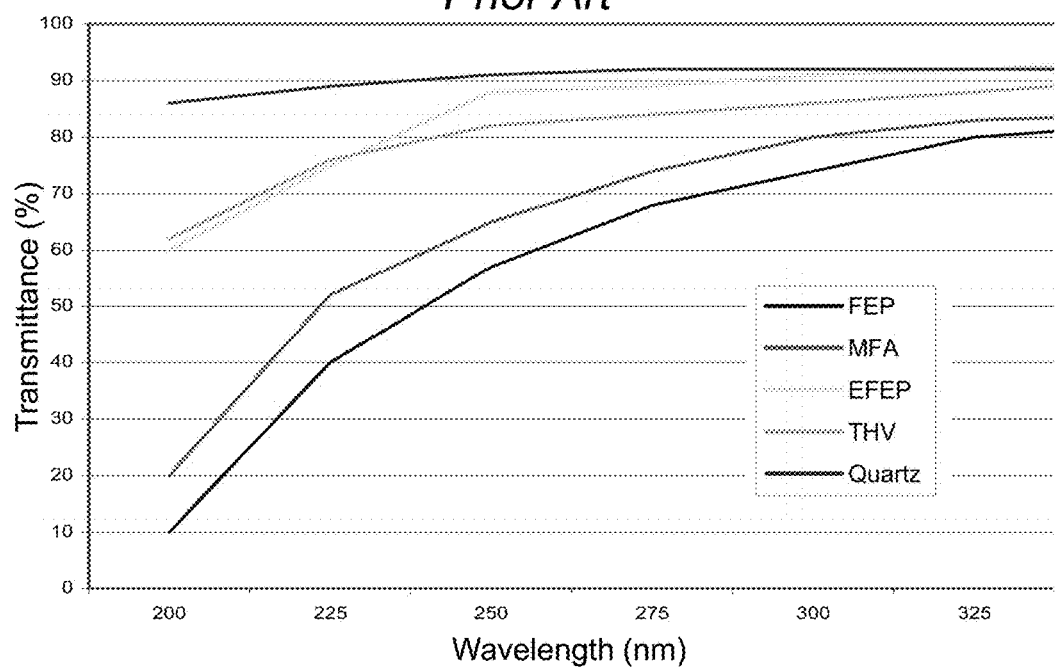
FIGS. 1A-1F show optical transmittance as a function of wavelength for various fluoropolymers as shown in the prior art.
Figure 1B:
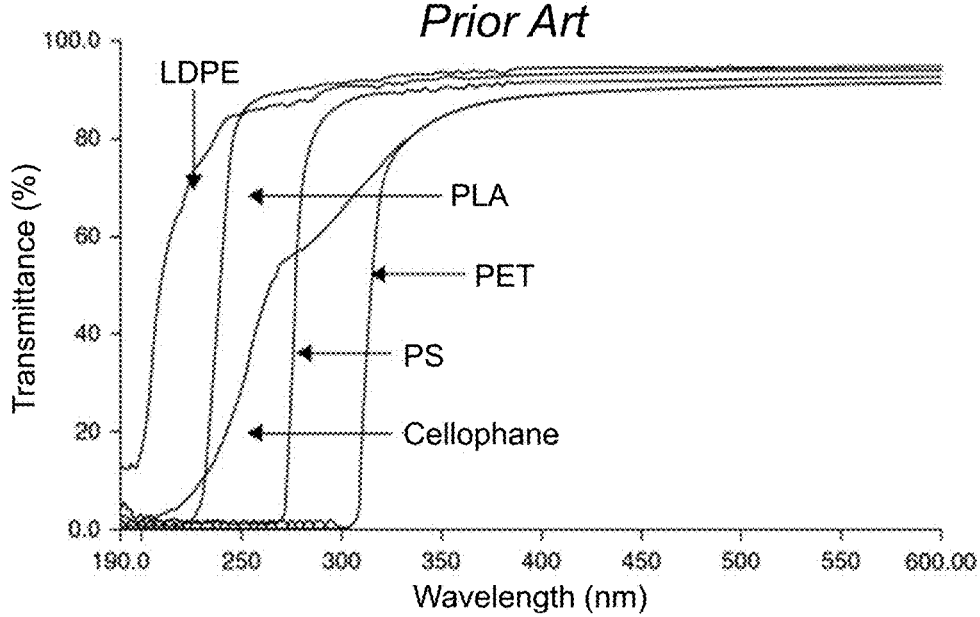
Figure 1C:
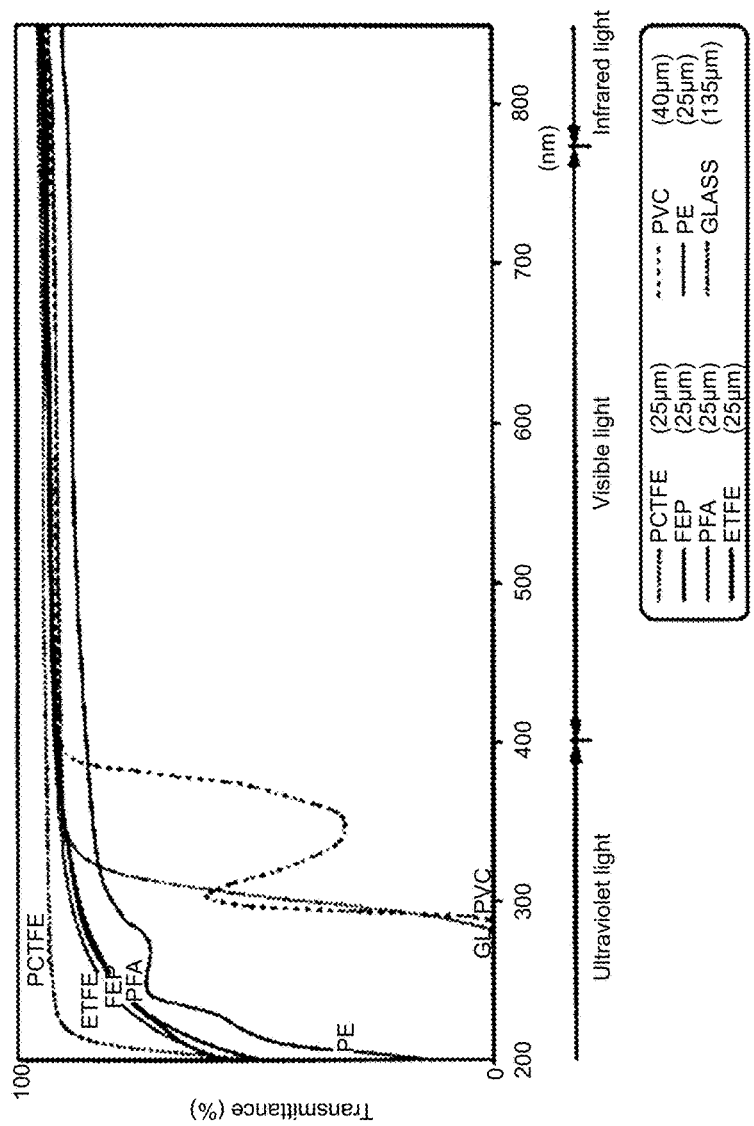
Figure 1D:
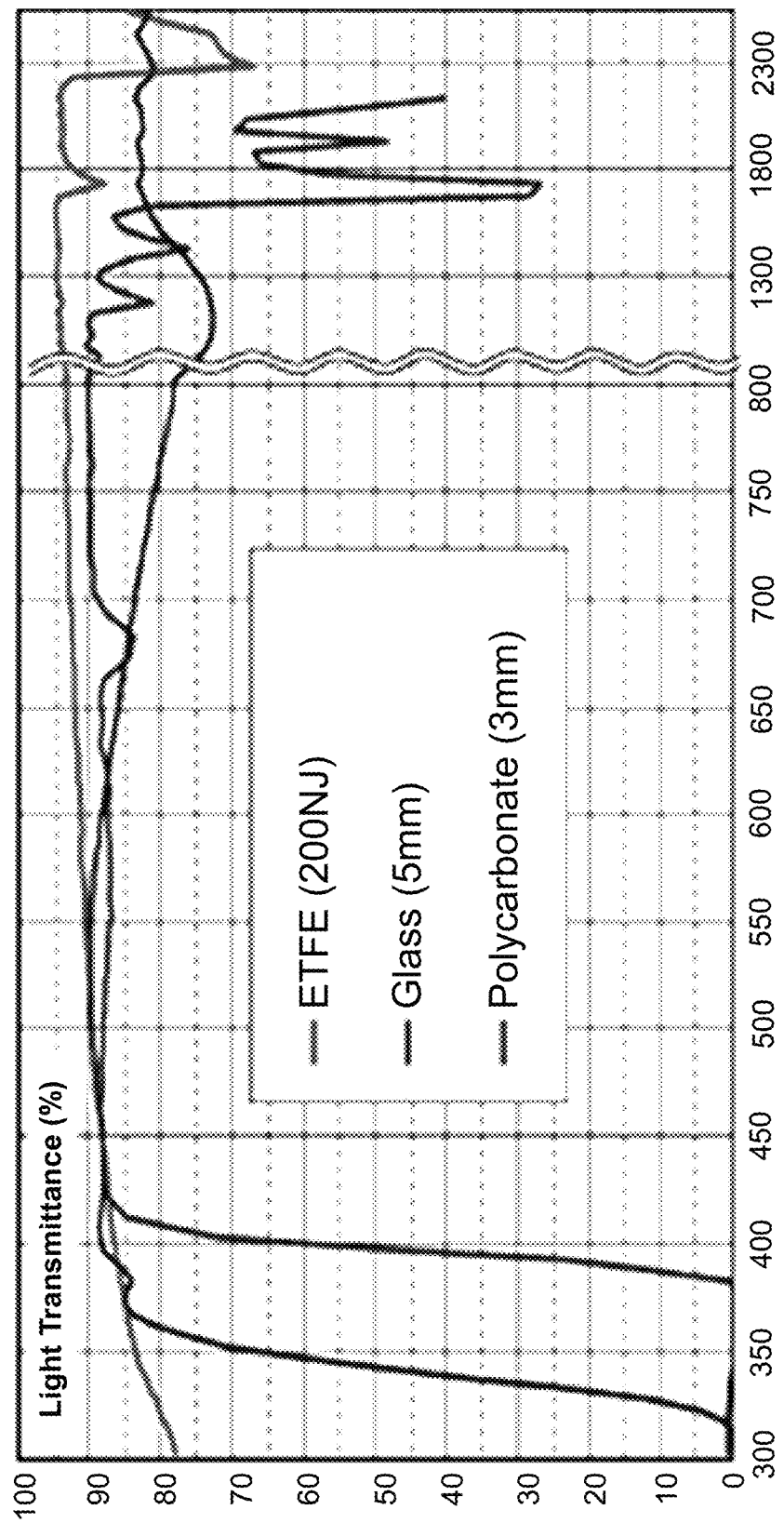

As indicated above, aspects of the invention provide a solution for packaging an optoelectronic device using an ultraviolet transparent polymer. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment. To this extent, the resulting packaged optoelectronic device can have one or more benefits over prior art solutions including, for example, a comparable operating lifetime for different ambient environments (e.g., water, a high humidity environment, air, etc.).

As used herein, unless otherwise noted, the term "set" means one or more (i.e., at least one) and the phrase "any solution" means any now known or later developed solution. As also used herein, a layer is a transparent layer when the layer allows at least thirty percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent). It is understood that, unless otherwise specified, each value is approximate and each range of values included herein is inclusive of the end values defining the range.

Embodiments are directed to the use of a fluoropolymer in packaging of an optoelectronic device. A listing of illustrative fluoropolymers follows. However, it is understood that this listing is not inclusive and other fluoropolymers, including silicon-based polymers, quartz, cellophane, and/or the like, can be utilized. FIGS. 1A-1F show optical transmittance as a function of wavelength for various fluoropolymers as shown in the prior art. As illustrated, these polymers are transparent to at least a portion of radiation in the wavelength range of 200-380 nanometers. Furthermore, some of these polymers are highly transparent (e.g., have a transmission of at least eighty percent for a thin film (e.g., 200 microns or less)) for at least a portion of ultraviolet radiation.

Polytetrafluoroethylene (PTFE) is a polymer including recurring tetrafluoroethylene monomer units whose formula is $[CF_2-CF_2]_n$. PTFE does not melt to form a liquid and cannot be melt extruded. On heating the virgin resin, it forms a clear, coalescent gel at 626° F.±18° (330° C.±15°). Once processed, the gel point (often referred to as the melting point) is 18° F. (10° C.) lower than that of the virgin resin. PTFE is generally sold as a granular powder, a fine powder, or an aqueous dispersion. Each is processed in a different manner.

Fluorinated ethylene propylene (FEP) resin is a copolymer of tetrafluoroethylene and hexafluoropropylene with the formula $[(CF(CF_3)-CF_2)x(CF_2-CF_2)_y]_n$. FEP has a melting point range of 473°-536° F. (245°-280° C.) and is melt processable. FEP is supplied in the form of translucent pellets, powder, or as an aqueous dispersion.

Ethylene chlorotrifluoroethylene (ECTFE) is a copolymer of ethylene and chlorotrifluoroethylene having the formula $[(CH_2-CH_2)_x-(CFCl-CF_2)_y]_n$. ECTFE has a melting point range of 428°-473° F. (220°-245° C.) and is melt processable. ECTFE is available in the form of translucent pellets and as a fine powder.

Polychlorotrifluoroethene (PCTFE) is a polymer of chlorotrifluoroethylene with the formula $[CF_2-CFCl]_n$. PCTFE has a melting point range of 410°-428° F. (210°-220° C.) and is melt processable. PCTFE is available in pellet, granular and powder form.

Perfluoroalkoxy alkanes (PFA) resins are copolymers of TFE fluorocarbon monomers containing perfluoroalkoxy side chains. PFA melts at 536° F. (280° C.) minimum and is melt processable. PFA is available in the form of pellets, powder, and as an aqueous dispersion.

Polyvinylidene difluoride (PVDF) is a homopolymer of vinylidene fluoride having the formula $[CH_2-CF_2]_n$ or a copolymer of vinylidene fluoride and hexafluoropropylene having the formula $[CF(CF_3)-CF_2)_x(CH_2-CF_2)_y]_n$. Copolymers of vinylidene fluoride are also produced with (1) chlorotrifluoroethylene, (2) tetrafluoroethylene, and (3) tetrafluoroethylene and hexafluoropropylene. These are all sold as PVDF copolymers. PVDF polymers/copolymers melt at 194°-352° F. (90°-178° C.), are melt processable, and are supplied in the form of powder, pellets, and dispersions.

Figure 1E:
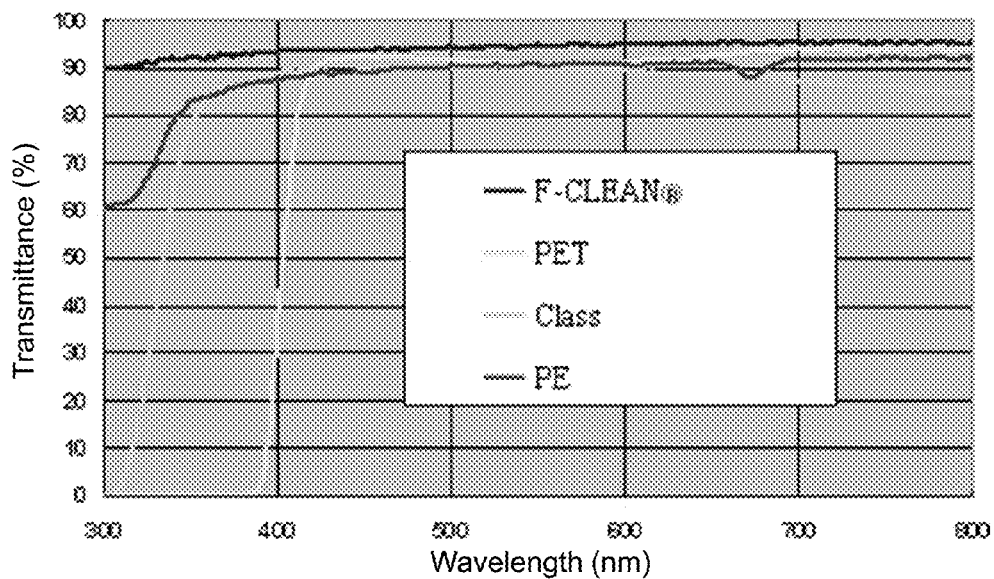
Figure 1F:
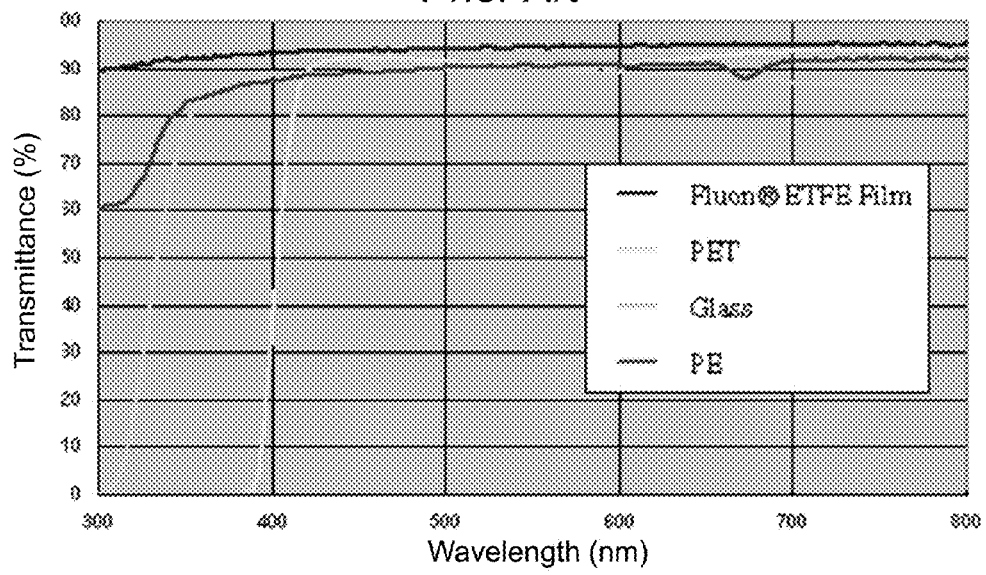

Ethylene tetrafluoroethylene (ETFE) is a copolymer of ethylene and tetrafluoroethylene of the formula $[(CF_2-CF_2)_x-(CH_2-CH_2)_y]_n$. ETFE melts at 428° F. (220° C.) minimum. ETFE is melt processable and is supplied in pellet and powder form. A fluorine based plastic, ETFE (ethylene tetrafluoroethylene) offers impressive corrosion resistance and strength over a very wide temperature range. Since ETFE is melt processable, it can be utilized in a vast range of applications. FIGS. 1E and 1F show optical transmittance as a function of wavelength for two illustrative brands of ETFE, F-CLEAN® and Fluon® ETFE offered by AGCCE Chemicals Europe, Ltd. As can be seen, ETFE has a high transparency even for ultraviolet light in the high wavelength range.

MFA is a copolymer of tetrafluoroethylene and perfluoromethylvinylether. MFA belongs to the generic class of PFA polymers. MFA melts at 536°-554° F. (280°-290° C.). MFA is available in the form of translucent pellets and aqueous dispersions.

Ethylene tetrafluoroethylene hexafluoropropylene fluoroterpolymer (EFEP) is a copolymer of ethylene, tetrafluoroethylene, and hexafluoropropylene with the formula $[(CH_2-CH_2)x(CF_2-CF_2)_y(CF(CF_3)-CF_2)_z]_n$. EFEP polymers melt at 311°-464° F. (155-240° C.), are melt processable, and are supplied in pellet form.

THV is a copolymer containing tetrafluoroethylene, hexafluoropropylene and vinylidenefluoride. THV is melt-processable with melting points from 240° to 455° F. (115° to 235° C.) depending on grade. THV is available in pellet, agglomerate or aqueous dispersions.

HTE is a copolymer of hexafluoropropylene, tetrafluoroethylene, and ethylene. HTE is melt processable with melting points from 310° to 420° F. (155° to 215° C.) depending on grade, and is available in pellet or agglomerate form.

Figure 2A:
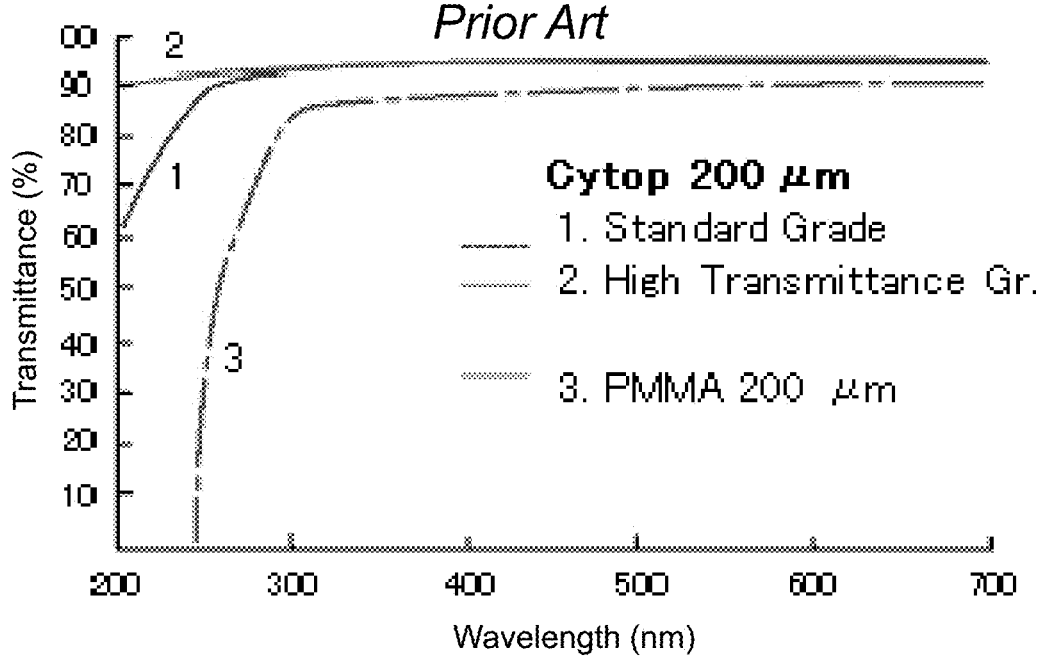
FIGS. 2A and 2B show optical transmittance as a function of wavelength for Cytop® and Teflon® AF, respectively, as shown in the prior art.
Figure 2B:
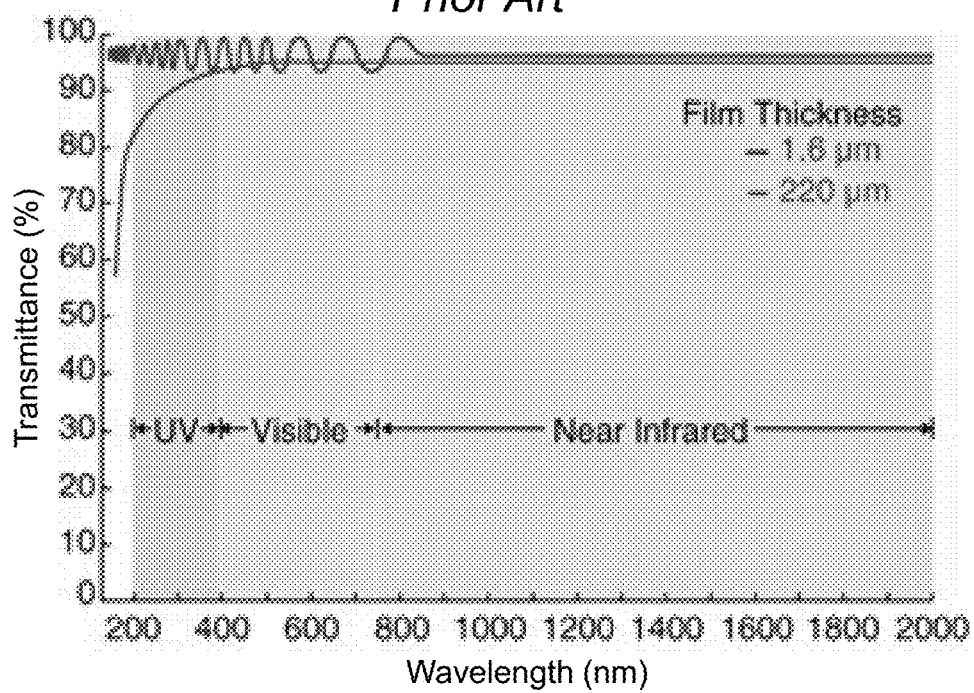

Some illustrative fluoropolymers are marketed under the brand names Teflon® AF (an amorphous fluoroplastic) offered by E. I. du Pont de Nemours and Company and Cytop® (an amorphous fluoropolymer) offered by Bellex International Corporation, which are currently sold as liquid solutions or gels. FIGS. 2A and 2B show optical transmittance as a function of wavelength for Cytop® and Teflon® AF, respectively, as shown in the prior art.

An embodiment utilizes an ultraviolet transparent fluoropolymer, such as one of the fluoropolymers discussed herein, in packaging an optoelectronic device. In a more specific embodiment, the optoelectronic device operates at a peak ultraviolet wavelength (referred to as an ultraviolet (UV) optoelectronic device). Several important factors for materials utilized in packaging an ultraviolet optoelectronic device include: transparency to ultraviolet radiation; stability to exposure to ultraviolet radiation, which can translate into a long operating lifetime for the material and the device without significant changes in optical, mechanical or chemical properties; a capability to protect the device from the environment, which can include mechanical dexterity and chemical inertness; and adhesion to surfaces of the optoelectronic device. In a more specific embodiment, a highly ultraviolet transparent fluoropolymer is utilized in the packaging. Such polymers are available and have a long lifetime when exposed to ultraviolet light.

However, it is understood that aspects of the invention are not limited to any particular material or group of materials listed herein. To this extent, numerous other materials or their combinations and solutions exist which can have appropriate properties and be utilized as described herein. For example, various polymers can be mixed, and various additional compounds can be added to the polymers (primarily when in the melted stage) to alter their mechanical, thermal, chemical and/or optical properties. In a specific example, a combination of several polymers can be utilized to improve adhesive properties of the solution.

In general, embodiments of the invention can be directed to any of various types of optoelectronic devices. For example, the optoelectronic device can be configured to operate as an emitting device, such as a light emitting diode (LED) or a laser diode (LD), a photo-multiplier, and/or as a light sensing device, such as a photodetector. The electromagnetic radiation emitted and/or sensed by the optoelectronic device can have a peak wavelength within any range of wavelengths, including visible light, ultraviolet radiation, deep ultraviolet radiation, infrared light, and/or the like. In an embodiment, the optoelectronic device is configured to emit and/or sense radiation having a dominant wavelength within the ultraviolet range of wavelengths. In another illustrative embodiment, the optoelectronic device operates in a spectral range from approximately 200 nanometers to approximately 400 nanometers.

A typical optoelectronic device includes a light emitting/sensing semiconductor heterostructure comprising: an n-type contact layer; a light generating/sensing structure having a first side adjacent to the n-type contact layer. The light generating/sensing structure can include a set of quantum wells and barriers. In addition, the heterostructure can include a p-type contact layer adjacent to the second side of the light generating/sensing structure. The p-type contact layer can be, for example, a semiconductor laminate structure. The entire structure can comprise group III nitride-based semiconductor layers of $Al_xB_yIn_zGa_{1-x-y-z}N$ composition (where $0 \le x,y,z \le 1$, and $x+y+z \le 1$), where, in general, molar fractions of all elements can vary from zero to one. An illustrative group III nitride-based p-type semiconductor laminate structure can include: an AlGaN electronic blocking layer with a high molar fraction of aluminum; an AlGaN grading layer or AlxGa1-xN/AlyGa1-yN superlattice; a set of GaN layers; p-GaN heavily doped layers; and/or the like. Regardless, an optoelectronic device can be fabricated by etching part of a p-contact and light generating structure to access the n-type contact layer. The n-type contact layer can be contacted with a n-type electrode. The device can be flip chip mounted on a submount. The submount, can be positioned inside a device package that can be mounted on a board capable of delivering power to operate the optoelectronic device.

Figure 3A:
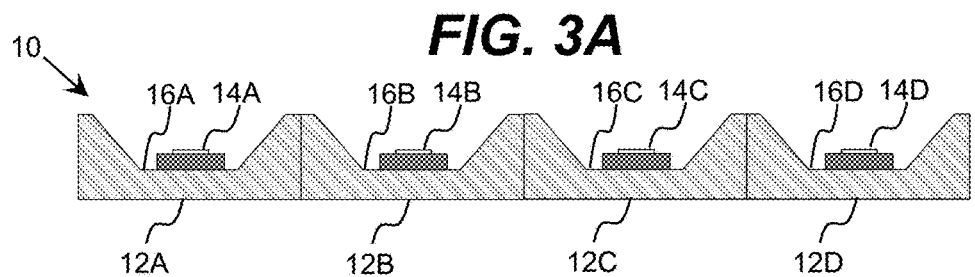
FIGS. 3A-3D show an illustrative packaging solution according to an embodiment.

FIGS. 3A-3D show an illustrative packaging solution according to an embodiment. As illustrated in FIG. 3A, a structure 10 can include an array of device packages 12A-12D arranged, for example, in a two-dimensional array. A plurality of optoelectronic devices 14A-14D can be surface mounted on a bottom surface 16A-16D of a three-dimensional depression on a surface of each device package 12A-12D. Each three-dimensional depression can form reflective sidewalls around the corresponding optoelectronic device 14A-14D. In an illustrative embodiment, the structure 10 is formed of a ceramic having at least an electrically insulating surface. Any of numerous insulating (e.g., dielectric) materials can be utilized. Illustrative materials include materials suitable for fabricating printed circuit boards (PCBs) including various pre-preg materials. More particular illustrative materials include: polytetrafluoroethylene (Teflon); materials formed of a resin (e.g., epoxy, polyester, phenolic, or the like) with a reinforcement (e.g., paper, woven glass, non-woven glass, or the like), such as, FR-1, FR-2, FR-3, FR-4, FR-5, FR-6, G-10, or the like; composite epoxy materials, such as, CEM-1, CEM-2, CEM-3, CEM-4, CEM-5, or the like; and/or the like.

In an embodiment, each device package 12A-12D can be formed of an ultraviolet transparent material, such as a fluoropolymer discussed herein. In this case, the sidewalls of each three-dimensional depression can have a different shape. Furthermore, when the material is a fluoropolymer discussed herein, the optoelectronic device 14A-14D can be mounted to the device package 12A-12D using a procedure described herein. In another embodiment, the array of device packages 12A-12D comprises a board, such as a printed circuit board, which includes device(s) and connection(s) capable of delivering power to the set of optoelectronic device 14A-14D (e.g., the n-type and p-type electrodes of each optoelectronic device 14A-14D).

Figure 3B:
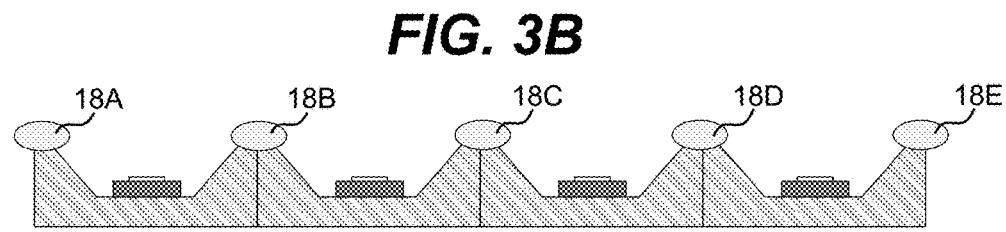
Figure 4A:
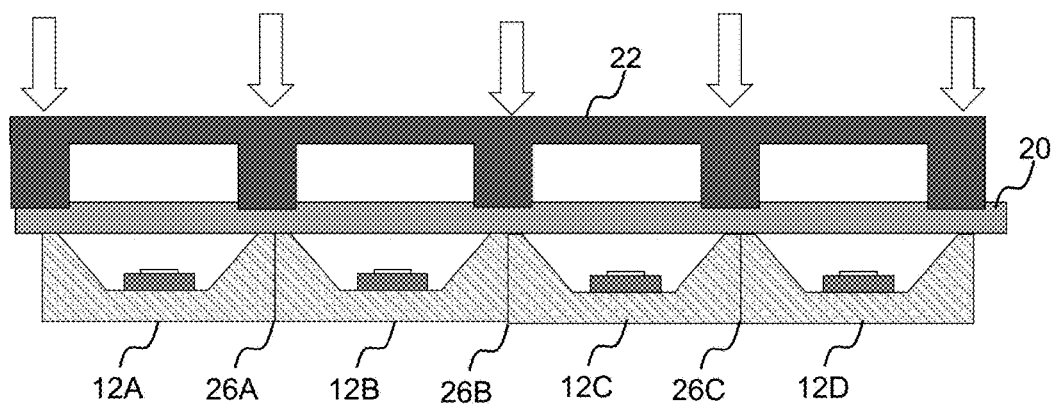
Figure 4B:
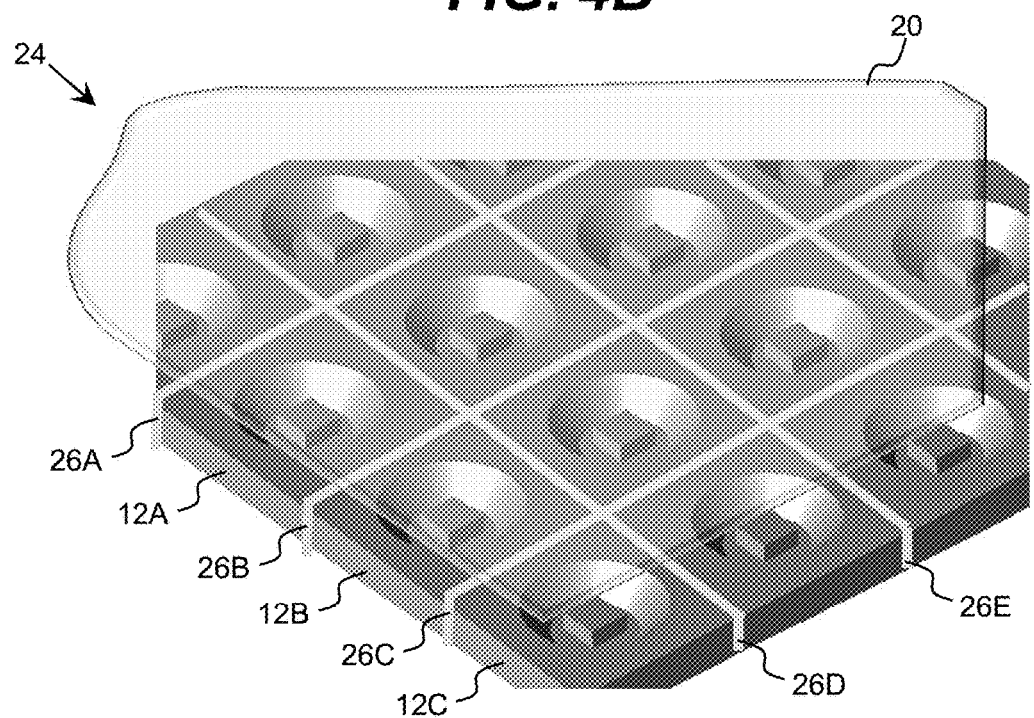
FIG. 4B shows a three-dimensional view of the resulting assembly according to an embodiment.

In FIG. 3B, an adhesive material 18A-18D can be applied to the topmost surface of the structure 10 at the junctions of adjacent device packages 12A-12D using any solution. The adhesive material 18A-18D can be any of various forms and materials of glues and adhesives. When the device packages 12A-12D are arranged in an array (e.g., as shown in FIG. 4B), the adhesive material 18A-18D can be long stripes of an adhesive material running along the edges between the adjacent device packages 12A-12D. In an illustrative embodiment, the adhesive material 18A-18D is EFEP. However, it is understood that this is only illustrative and any suitable adhesive can be utilized.

Figure 3C:
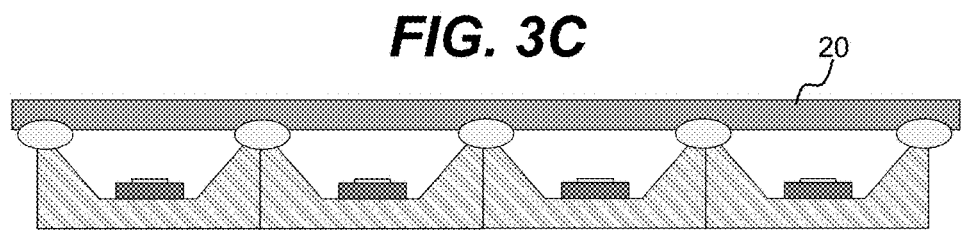
Figure 3D:
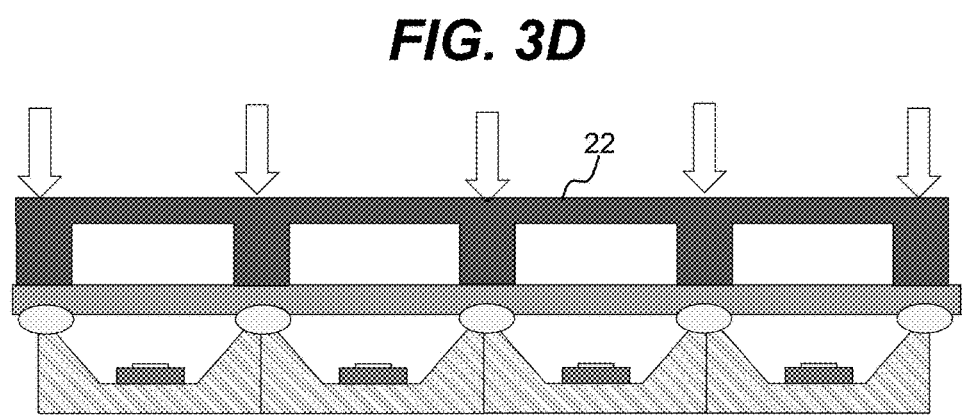

In FIG. 3C, a transparent polymer film 20 is placed over the top surface of the structure 10. In an embodiment, the transparent polymer film 20 completely covers all components of a device package 12A-12D that can benefit from protection from the environment (e.g., the optoelectronic device 14A-14D, the walls of the corresponding depression, and/or the like). In a more specific embodiment, the transparent polymer film 20 covers multiple adjacent device packages 12A-12D. In a still more specific embodiment, the transparent polymer film 20 covers all device packages 12A-12D in the structure 10. Regardless, the transparent polymer film 20 can adhere to the adhesive material 18A-18D. It is understood that the transparent polymer film 20 can be formed of any type of ultraviolet transparent material described herein. In an embodiment, a particular material for the transparent polymer film 20 is selected based on its transmittance for a peak wavelength of radiation for the corresponding optoelectronic device 14A-14D. In FIG. 3D, a stamp tool 22 can be used to apply a force on the transparent polymer film 20 at the locations of the adhesive material 18A-18D in order to secure the transparent polymer film 20 to the structure 10. The stamp tool 22 can be formed of any type of material that does not adhere to the transparent polymer film 20, e.g., steel, glass, and/or the like.

It is understood that the process shown in FIGS. 3A-3D is only illustrative of various processes. To this extent, one or more acts in the process can be modified and/or not performed and/or additional acts can be performed. For example, rather than the adhesive material 18A-18D being applied to a top surface of the structure 10, the adhesive material 18A-18D can be applied to the transparent polymer film 20 in locations corresponding to the top surface of the structure 10 when the transparent polymer film 20 is properly aligned with the structure 10. Furthermore, the process can include cleaning the transparent polymer film 20 prior to placing the film 20 over the top surface of the structure 10, e.g., by applying a cleaning agent or the like.

Furthermore, in addition to or alternative to applying a force on the transparent polymer film 20, the locations of the transparent polymer film 20 corresponding to the adhesive material 18A-18D can be heated to further promote a strong bond between the transparent polymer film 20 and the structure 10. In an embodiment, the transparent polymer film 20 is heated up to and/or beyond the melting temperature of the transparent polymer film 20, e.g., such that the transparent polymer film 20 (or a portion thereof) can become flowable. As used herein, flowable means that the film 20 (or a portion thereof) is softened and able to move due to the force of gravity, application of external pressure, and/or the like. In a more specific embodiment, the material for the transparent polymer film 20 is selected to have a sufficiently low melting temperature such that the required heat will not damage the optoelectronic device(s) 14A-14D. In a still more specific embodiment, the transparent polymer film 20 is formed of EFEP.

The heating can be performed using any solution. For example, the stamp tool 22 can include a laser, which can be configured to direct a laser onto a set of desired locations of the transparent polymer film 20 to induce localized or time depending heating of the desired location(s) of the transparent polymer film 20. Alternatively, the stamp tool 22, or the contact surface(s) thereof, can be heated, which will result in the heat being applied to the transparent polymer film 20 when the stamp tool 22 is contacting the transparent polymer film 20. Still further, the entire assembly 10, 20, 22 can be heated (e.g., within a heating chamber). Additionally, adhesion can be influenced by one or more chemical catalysts present in the environment while the transparent polymer film 20 is being adhered to the structure 10. In addition, adhesion can include curing using light of an appropriate wavelength. To this extent, the adhesive material 18A-18D also can include glue like polymers activated/cured by light.

In an embodiment, the transparent polymer film 20 can be securely attached to the structure 10 without the use of an adhesive material 18A-18D. To this extent, FIG. 4A shows a transparent polymer film 20 being applied to the structure 10 and FIG. 4B shows a three-dimensional view of the resulting assembly 24 according to an embodiment. As illustrated, the transparent polymer film 20 directly contacts the top surface of the device packages 12A-12D. The film 20 can be adhered to the device packages 12A-12D using pressure, heating (e.g., to induce melting and subsequent curing of the film 20), and/or the like.

Regardless, when the packaging process is complete, some or all of the device packages 12A-12D can be physically separated from one another using any solution. For example, the device packages 12A-12D can be cut using a laser, scribed and broken apart, sawed, and/or the like. In an embodiment, the device packages 12A-12D are separated from one another along the lines 26A-26E to create individual packaged optoelectronic devices capable of utilization in a variety of circuits. Regardless, after separation, the transparent polymer film 20 can be sufficiently adhered to the top surface of the device packages 12A-12D to provide effective protection from the environment for the components of the device package 12A-12D. In an embodiment, some or all of the device packages 12A-12D can remain physically connected, e.g., to create a structure including multiple packaged optoelectronic devices 14A-14D (FIG. 3A). Alternatively, all of the device packages 12A-12D can be physically separated from one another to create multiple individually useable packaged optoelectronic devices 14A-14D.

It is understood that the packaging process can include various modifications and/or additions. For example, FIGS. 5A-5D illustrate packaging processes in which the transparent polymer film is molded to a shape of the top surface of the device packages 12A-12D according to embodiments. In this case, as shown in FIG. 5A, a transparent polymer film 20 can be placed on the top surface of the device packages 12A-12D as described herein. Subsequently, a vacuum can be utilized to reduce the pressure within each cavity 30A-30D formed by the polymer film 20 and depressions of the device packages 12A-12D. In response, the transparent polymer film 20 will collapse into the cavity 30A-30D, eventually coating the top surface of the device packages 12A-12D (e.g., similar to a shrink wrap) as shown in FIG. 5B. The pressure can be sufficient to cause the transparent polymer film 20 to adhere to the top surface of the device packages 12A-12D.

In an embodiment, the entire structure 10 is placed within a vacuum chamber to produce the desired reduction in pressure within each cavity 30A-30D. Furthermore, the structure 10 can include one or more features to further reduce the pressure within the cavities 30A-30D. For example, FIG. 5C shows a structure 10 including channels 32A, 32B extending partially through the device packages 12A-12D and intersecting with the cavities 30A-30D. Similarly, FIG. 5D shows a structure 10 including through holes 34A, 34B located on the bottom surfaces of the cavities 30A-30D and extending through the device packages 12A-12D. FIGS. 5A and 5B show an alternative configuration in which multiple through holes 34A, 34B are located in each device package 12A-12D. In each case, the channels 32A, 32B and/or through holes 34A, 34B can facilitate the flow of air out of the cavities 30A-30D, thereby enabling air to be expunged from the cavities 30A-30D while they are covered by the transparent polymer film 20.

Regardless, it is understood that the process shown in FIGS. 5A-5D can utilize heat to further induce adhesion between the transparent polymer film 20 and the device packages 12A-12D as described herein. To this extent, the entire structure 10 can be heated, e.g., to an approximate melting point of the transparent polymer film 20, prior to, during, and/or after the pressure is reduced within the cavities 30A-30D.

It is understood that use of vacuum pressure is only illustrative of various approaches that can be utilized to mold the transparent polymer film 20 to a surface of the device packages 12A-12D. To this extent, FIGS. 6A and 6B show another embodiment of packaging a set of device packages 12A-12D according to an embodiment. In this case, the transparent polymer film 20 includes a plurality of markers 21A, 21B. Each marker 21A, 21B can be formed using any solution. For example, a marker 21A, 21B can comprise a visibly distinct particle included in the transparent polymer film 20. For example, the markers 21A, 21B can be a metallic or ceramic material, such as aluminum, alumina, or the like. However, it is understood that each marker 21A, 21B can be formed of any visibly observable material, which will not adversely impact fabrication and/or operation of the structure in a significant manner. As shown in FIG. 6A, a camera 23 can record a position of the markers 21A, 21B when the film 20 is initially applied onto the set of device packages 12A-12D. Subsequently, the structure 10 can be heated to a point at which the film 20 is softened and begins to flow, e.g., due to gravity or another pressure being applied. As a result of the flow, the markers 21A, 21B begin to move (as illustrated by the arrows in FIG. 6B), and the camera 23 can record the movement.

A computer system 25 (e.g., programmed computing device) can analyze the motion of the markers 21A, 21B using the image data acquired by the camera 23. Furthermore, the computer system 25 can estimate one or more properties of the film 20 based on the rate of the motion of the markers 21A, 21B. For example, the computer system 25 can determine that the film 20 has encapsulated the devices once motion of the markers 21A, 21B has stopped after a period of rapid motion as shown in FIG. 6B. At this point, the computer system 25 can apply a pressure to induce adhesion between the film 20 and the device packages 12A-12D.

The computer system 25 can analyze the motion of the set of markers 21A, 21B and can adjust one or more parameters (e.g., heating, pressure/vacuum, and/or the like) of the system based on the rate of marker motion. For example, when the computer system 25 determines that no significant marker motion has occurred after an initial period of time (e.g., twenty minutes), the computer system 25 can increase a temperature in the chamber to induce further melting of the film 20. It is understood that the camera 23 can be positioned at any angle, which provides favorable image data for detecting the motion of the markers 21A, 21B. Additionally, the computer system 25 can evaluate one or more optical properties (in visible and/or ultraviolet spectra) of the film 20 to determine when to commence applying pressure, increase temperature, and/or the like. It is understood that the examples above are only illustrative and other embodiments of a process in which the computer system 25 alters one or more parameters (e.g., the temperature, pressure, and/or the like) in response to the optical parameters of the polymer film 20, the position of markers 21A, 21B, and/or the rate of their motion are possible.

In a specific illustrative embodiment, a film 20 of EFEP is used to encapsulate a set of ultraviolet optoelectronic device mounted within a set of device package 12A-12D. EFEP can be utilized due to several beneficial properties: a melting temperature sufficiently low to avoid damaging the device; highly adhesive to the device, submount, and mounting board; and/or the like.

In a specific illustrative procedure corresponding to the EFEP film 20, the film 20 has a thickness in a range of 100-250 microns. After being placed on the device package(s) 12A-12D, the film 20 is heated to a temperature in a range of 180-240° C. for at least one hour at pressures between 20 and 60 Torr. In a more specific procedure, the heating is conducted for approximately two hours. In an alternative embodiment, the computer system 25 can monitor the film 20 and terminate the heating once the film 20 becomes flowable (e.g., motion of the surface of the film is visible, or at least involves a few millimeters of displacement). The EFEP film 20 can experience a distinct phase transition when heated to a temperature approximate to its melting temperature. The phase change is accompanied with a change of transparent properties of the material 20, where a previously opaque material becomes transparent to visible and UV radiation. An embodiment of the process includes heating the EFEP film 20 at least to temperatures where the phase change occurs. A further embodiment includes maintaining a temperature until the material is at least twenty percent more transparent to visible and/or ultraviolet radiation (more specifically ultraviolet radiation between 240-360 nanometers) than prior to the phase change.

An embodiment of a process uses time dependent heating of the film 20. For example, the computer system 25 can operate a heating element (e.g., in a heating chamber) to heat the film 20 to a first temperature, $T1$, to induce a phase transition for a duration of time, $t1$. Subsequently, the computer system 25 can increase the temperature to a second temperature, $T2$, in order to improve the adhesion of the film 20 to the optoelectronic device(s) and/or device package(s) for a duration of time, $t2$. For clarity, the first heating stage can be referred as a phase changing stage, and the second stage can be referred to as an adhesive stage.

At the start of the process, the computer system 25 can monotonically increase the temperature, for example, at a rate slower than one degree Celsius per second, and more preferably at one degree Celsius per few minutes. Once attained, the temperature can be maintained at the temperature $T1$ for a duration of time $t1$. Subsequently, the computer system 25 can again monotonically increase the temperature to the temperature $T2$ at a preferable rate of about one degree per few minutes, and maintain the temperature at the temperature $T2$ for a duration of time $t2$, before commencing a cool down phase. The temperature $T1$ can be in a range of 180-210 C and the temperature $T2$ can be in a range of 200-240 C. Both of the times $t1$ and $t2$ can be in a range of 5-60 min, with $t2$ being preferably in the range of 5-30 min. In an embodiment, the heating and cooling cycle can comprise several periods. In addition, during the adhesive stage, a vacuum can be applied. In one embodiment, the computer system 25 applies the vacuum at about one third of the time through the time $t2$. In more specific embodiment, the computer system 25 further applies pressure at about two thirds of the time through the time $t2$, which can provide for better adhesion. The vacuum and pressure cycles can comprise several periods throughout the adhesive phase.

It is understood that the heating process can be altered depending on the properties of the UV transparent film 20 being utilized. For example, a Daikin RP-4020 EFEP polymer film can be heated in the range of 180-210 C, while a Daikin RP-5000 EFEP polymer film can be heated in the range of 220-240 C. It is further understood that a process can include applying several films 20 one over the other. In this case, the procedure can include encapsulating with the first film using a first heating process and encapsulating with the second film using a second heating process, where each heating process involves selection of optimal heating temperatures, pressures, and times needed for applying heating and pressure for the corresponding film. When multiple films are utilized, an illustrative embodiment uses EFEP material as the first film applies directly adjacent to the top surface of the device package 12.

Figure 7A:
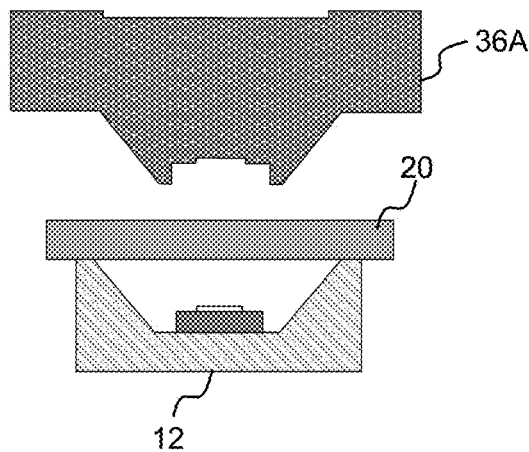
FIGS. 7A-7C illustrate use of a stamp tool in packaging a device package according to embodiments.
Figure 7B:
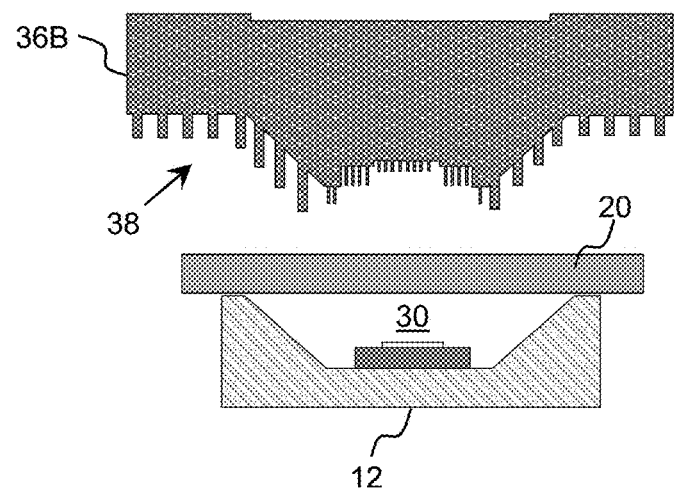
Figure 7C:
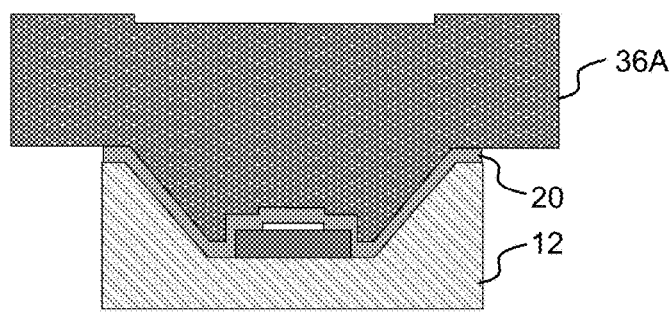

FIGS. 7A-7C illustrate use of a stamp tool 36A, 36B in packaging a device package 12 according to embodiments. As shown in FIG. 7A, a surface of the stamp tool 36A can form an inverse shape as that of the top surface of the device package 12. The stamp tool 36A can be formed using any solution, such as mold casting, or the like. Regardless, as shown in FIG. 7C, after placing the transparent polymer film 20 over the top surface of the device package 12, the stamp tool 36A can be lowered to force the transparent polymer film 20 down onto the surfaces of the device package 12.

As shown in FIG. 7B, a stamp tool 36B can include protrusions 38 extending from the surface, which can be configured to deliver point adhesion of the transparent polymer film 20 and/or provide gaps to allow air to escape from within the cavity 30. It is understood that an adhesive, heat, pressure, and/or the like, can be utilized in addition to a stamp tool 36A, 36B as described herein to facilitate adhesion between the transparent polymer film 20 and the device package 12. Additionally, it is understood that while a single device package 12 is shown for clarity, a stamp tool 36A, 36B can have a surface configured to concurrently mold multiple device packages 12, e.g., located in an array.

Figure 8A:
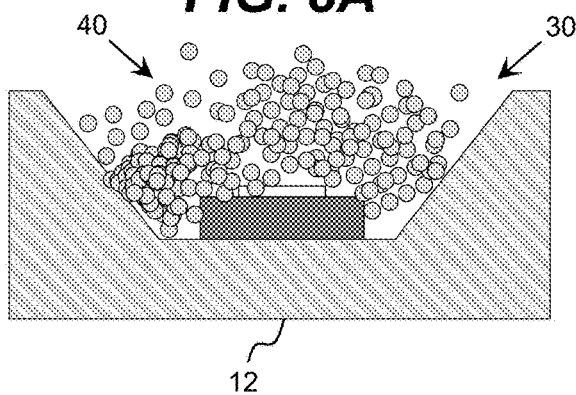
FIGS. 8A-8D illustrate use of a powder to encapsulate components of an optoelectronic device package according to embodiments.
Figure 8B:
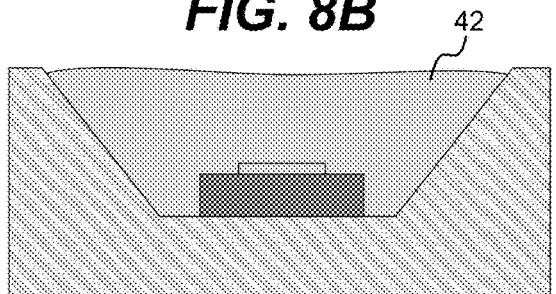

It is understood that use of a transparent polymer film 20 is only illustrative of approaches for protectively covering components of an optoelectronic device package 12. To this extent, FIGS. 8A-8D illustrate use of a transparent polymer powder to encapsulate components of an optoelectronic device package according to embodiments. For example, as shown in FIGS. 8A, 8B, a powder 40 comprising particles (e.g., pellets) of a transparent polymer can be deposited within a cavity 30 of a device package 12 in which the optoelectronic device is mounted. Subsequently, the powder 40 can be subjected to heating to cause the powder 40 to melt and subsequently cure to form a protective transparent coating 42 as shown in FIG. 8B. Prior to and/or concurrent with the heating, the powder 40 can be packed to a target density using any solution (e.g., a stamp tool).

Figure 8C:
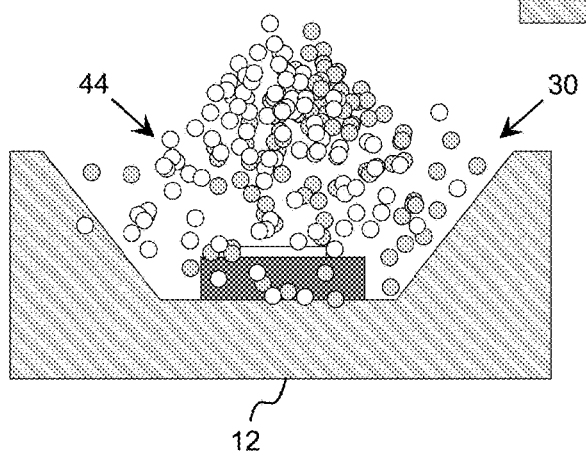
Figure 8D:
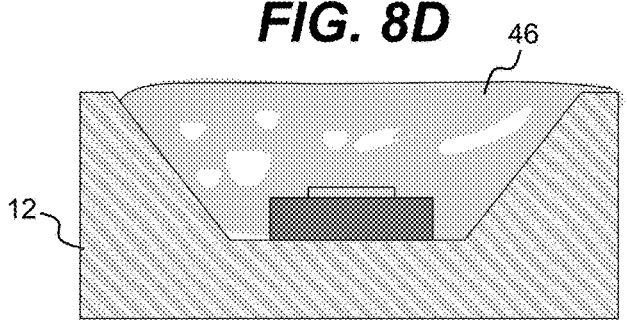

As illustrated by FIGS. 8C, 8D, a powder 44 can include a mixture of two or more materials (indicated by different colors of particles), which is subsequently melted and allowed to cure to form a transparent coating 46. A combination of two or more materials can be selected to provide any of various possible benefits. For example, when the materials have a refractive index mismatch, the transparent coating 46 can produce a diffusive scattering of ultraviolet radiation emitted by the optoelectronic device. Additionally, particles of other ultraviolet transparent materials and/or ultraviolet transparent materials in liquid form can be placed within the cavity 30 and incorporated into the transparent coating 46. For example, illustrative materials include: fused silica powders; fused silica spheres; domains containing sapphire, AlN, air, water and/or any other stable UV transparent media; and/or the like. Furthermore, in addition to ultraviolet transparent materials, ultraviolet reflective media (e.g., a powder, a film, and/or the like), ultraviolet fluorescent materials (e.g., phosphorus), and/or the like, can be placed within the cavity 30 and incorporated into the coating 46. In an embodiment, use of a powder 40, 44 can be combined with use of a transparent polymer film as described herein in order to encapsulate optoelectronic device(s).

A transparent coating 42, 46 can be shaped to provide any type of wave guiding structure using any solution. For example, a surface of the transparent coating 42, 46 can form a lens. In an embodiment, such a surface is formed by using a molding enclosure to shape the powder 40, 44 when melting and allowing the powder 40, 44 to cure. In other embodiments, a wave guiding structure can be applied to a surface of a transparent coating. To this extent, FIGS. 9A-9C show illustrative optoelectronic device packages including wave guiding structures according to embodiments.

Figure 9A:
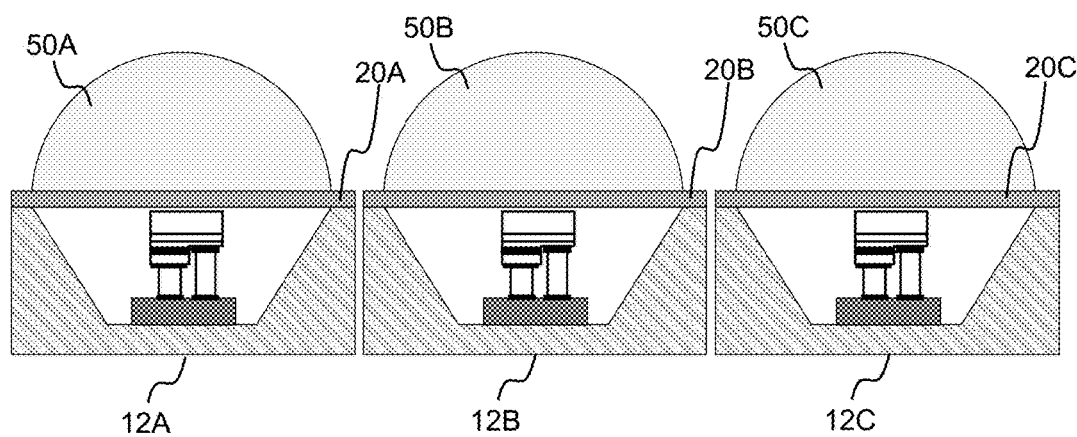
FIGS. 9A-9C show illustrative optoelectronic device packages including wave guiding structures according to embodiments.
Figure 9B:
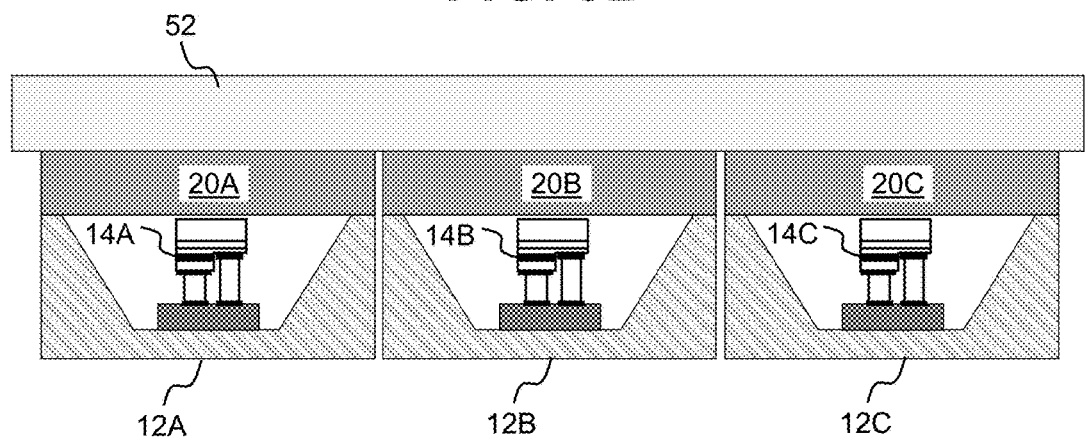
Figure 9C:
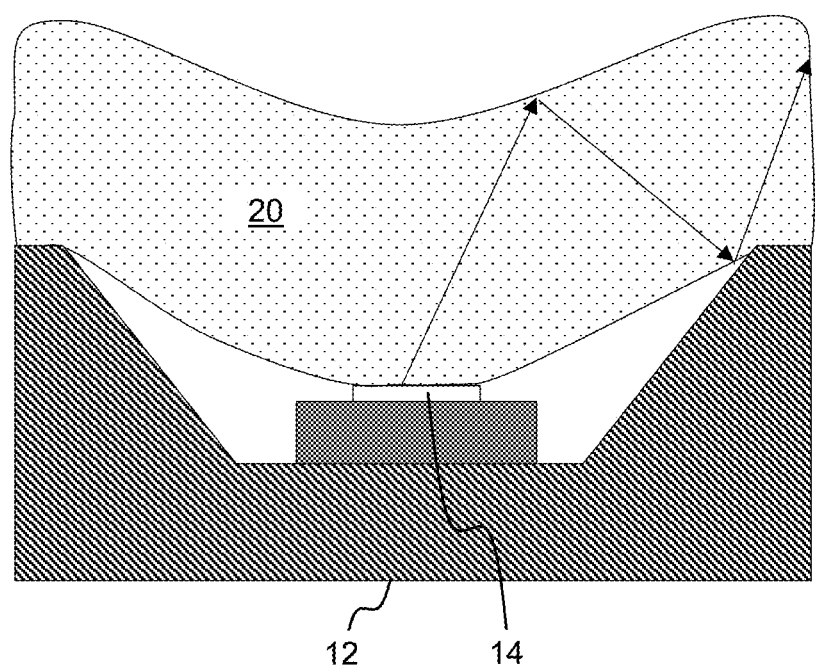

In FIG. 9A, each device package 12A-12C includes a transparent polymer film 20A-20C with a lens 50A-50C attached thereto. A lens 50A-50C can be formed of any type of ultraviolet transparent material, such as sapphire, fused silica, a transparent polymer, and/or the like. Furthermore, a lens 50A-50C can be fabricated using any solution (e.g., melting a powder or other particles in a molding enclosure). Regardless, each lens 50A-50C can be attached to the transparent polymer film 20A-20C using any solution, either before or after the device packages 12A-12C have been separated from one another.

A lens is only illustrative of various types of optoelectronic components, such as wave guiding components, that can be attached to the device packages 12A-12C. For example, FIG. 9B shows an optical fiber 52 coupled to a set of device packages 12A-12C according to an embodiment. In this case, each device package 12A-12C includes a corresponding transparent polymer film 20A-20C to which the optical fiber 52 is attached using any solution. In a more particular embodiment, each device 14A-14C can be configured to emit ultraviolet radiation at a different peak wavelength. In this case, ultraviolet radiation of multiple peak wavelengths can be coupled using the optical fiber 52. In another embodiment, a wave guiding structure can couple multiple devices 14A-14C to facilitate their cooperative operation. For example, an ultraviolet LED can be coupled with a laser diode, and the ultraviolet LED can be configured to provide optical pumping for the laser diode.

The lens 50A-50C and optical fiber 52 can be attached to the transparent polymer film 20A-20C using any solution. For example, a lens 50A-50C or optical fiber 52 can be placed adjacent to the transparent polymer film 20A-20C while at least a portion of the transparent polymer film 20A-20C is heated to become flowable. As a result, the lens 50A-50C or optical fiber 52 can partially submerge into the transparent polymer film 20A-20C, and upon cooling of the transparent polymer film 20A-20C, the lens 50A-50C or optical fiber 52 will be physically attached. In a more specific embodiment, in order to improve adhesion to the transparent polymer film 20A-20C, at least a surface of the transparent polymer film 20A-20C adjacent to the lens 50A-50C or optical fiber 52 can contain an adhesive polymer (e.g., EFEP), which can further promote adhesion of the lens 50A-50C. Other solutions can utilize, for example, an ultraviolet transparent epoxy, glue, and/or the like, to adhere the transparent polymer film 20A-20C to the lens 50A-50C or optical fiber 52.

In an embodiment, the transparent polymer film can be configured to provide wave guiding to the light emitted from the device. For example, FIG. 9C shows a device package 12 with a transparent polymer film 20 capable of providing wave guiding for the light emitted by the device 14 (e.g., as shown by arrows). In this case, the transparent polymer film 20 can have a larger thickness (e.g., 100 microns to several millimeters). A thickness of the film 20 can be varied to allow for optimal directional distribution of the intensity of the radiated light using any solution.

It is understood that wave guiding structures are only illustrative of various structures/devices that can be efficiently coupled using a transparent polymer, such as a transparent polymer film 20A-20C, described herein. For example, as shown and described in U.S. Provisional Application No. 61/949,650 and U.S. patent application Ser. No. 14/640,051, both of which are incorporated herein by reference, a structure, such as a surface of an electronic gadget, can be coupled to a set of device packages 12A-12C via the transparent polymer film 20A-20C. For example, the transparent polymer film 20A-20C described herein can comprise a screen for the corresponding electronic gadget.

Figure 10C:
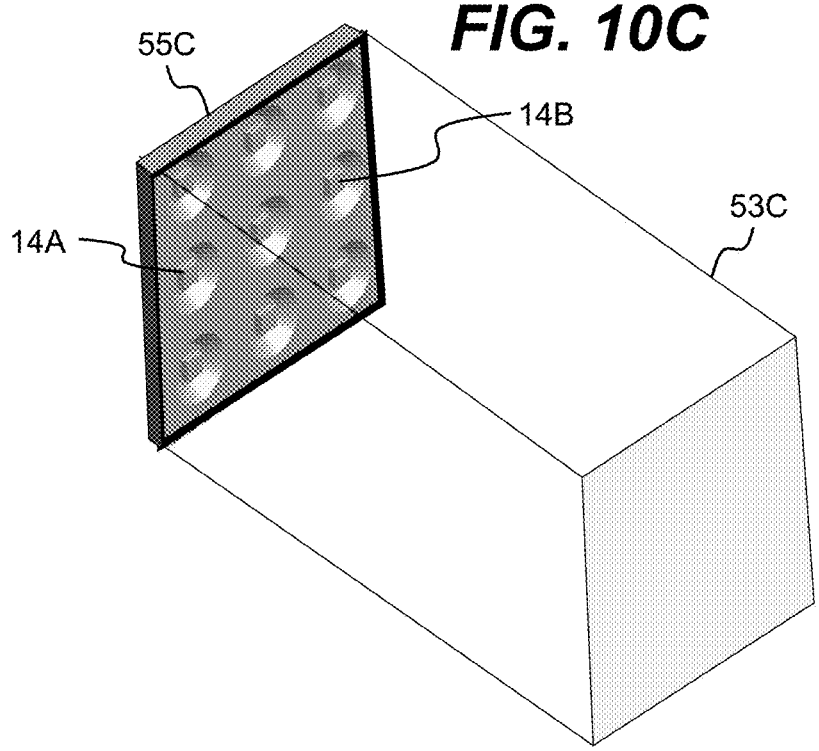
FIGS. 10A-10C show external structures coupled to device packages according to embodiments.
Figure 10A:
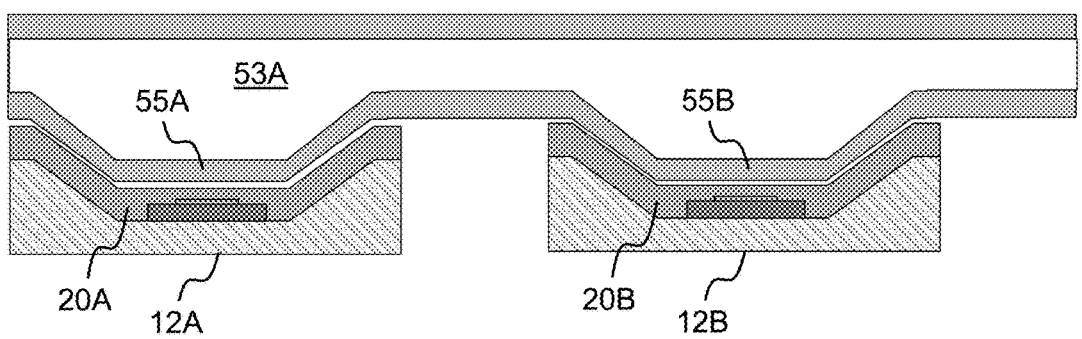
Figure 10B:
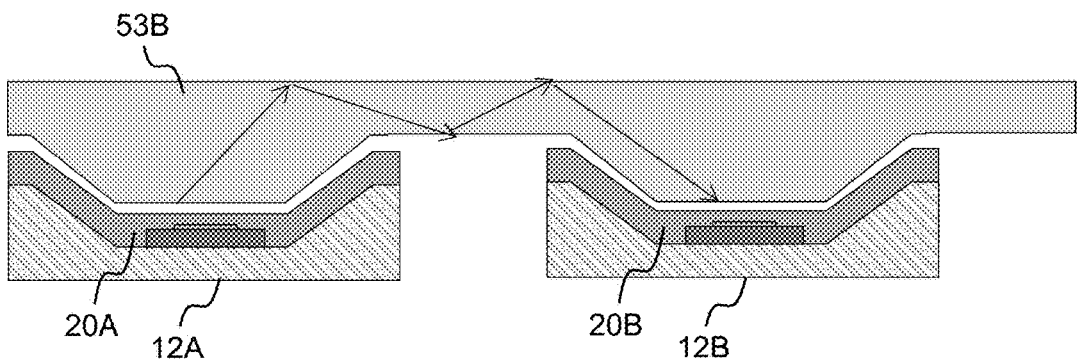

To this extent, FIGS. 10A-10C show external structures 53A-53C coupled to device packages 12A, 12B according to embodiments. In FIG. 10A, the structure 53A can comprise, for example, an enclosure, such as a pipe or the like. In this case, the device packages 12A, 12B can be coupled such that ultraviolet radiation is directed into the enclosure, e.g., for disinfection. At least portions 55A, 55B of the walls of the structure 53A can be formed of an ultraviolet transparent material (e.g., a polymer described herein). Alternatively, as shown in FIG. 10B, the structure 53B can comprise an ultraviolet transparent wave guiding structure. In this case, the structure 53B can be utilized to couple several optoelectronic devices, such as multiple ultraviolet LEDs, a combination of ultraviolet LED(s) and ultraviolet detector(s), and/or the like. In FIG. 10C, an array of device packages including optoelectronic devices 14A, 14B forms a wall 55C of an enclosure structure 53C. In this case, the transparent polymer film covering the optoelectronic devices 14A, 14B can keep the optoelectronic devices 14A, 14B separated from the interior volume of the structure 53C and any media (e.g., flowable media) present therein. The optoelectronic devices 14A, 14B can be operated to disinfect the media within the structure 53C.

The structure 53A, 53B can be coupled to the device packages 12A, 12B using a solution similar to that utilized when the film 20A, 20B is applied to the device packages 12A, 12B. For example, the structure 53A, 53B can be placed in a desire location with respect to the film 20A, 20B for a device package 12A, 12B and heat and/or pressure can be applied to fuse the structure 53A, 53B into the film 20A, 20B. To promote a better attachment, the pressure can be applied on the portions 55A, 55B, where the device is adjacent to the structure 53A, 53B. It is understood that such an attachment process can be performed concurrently with attaching the film 20A, 20B to the device package 12A, 12B or before or after such attachment. Additionally, it is understood that while both structures 53A, 53B are shown having shapes configured to match the cavity of the device package 12A, 12B, this is only illustrative, and the structures 53A, 53B can have substantially straight sides, which can be attached to the film 20A, 20B. For the structure 53C, the device packages can first be attached to a transparent wall in a similar manner. Alternatively, the device packages 12A, 12B can be attached to the wall 55C via the side or bottom surfaces of the device packages 12A, 12B. In an embodiment, an array of device packages 12A, 12B are not separated from one another after production and are utilized as the wall 55C.

Figure 11A:
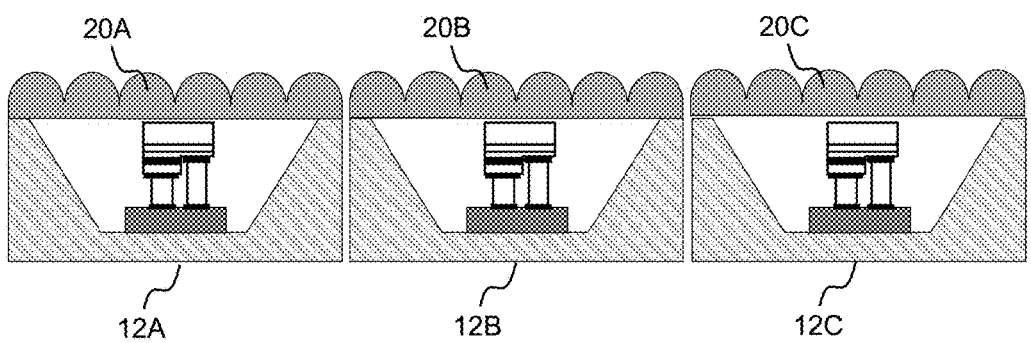
FIGS. 11A-11E show illustrative patterned transparent polymer films according to embodiments.
Figure 11B:
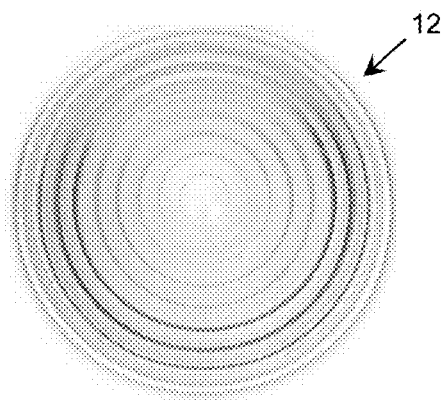
Figure 11C:
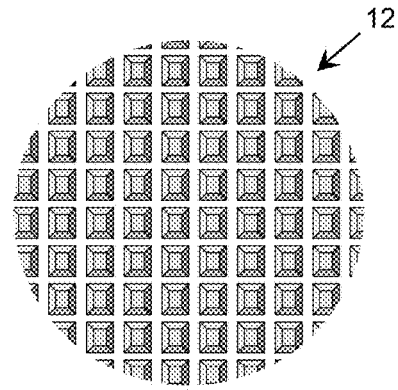
Figure 11D:
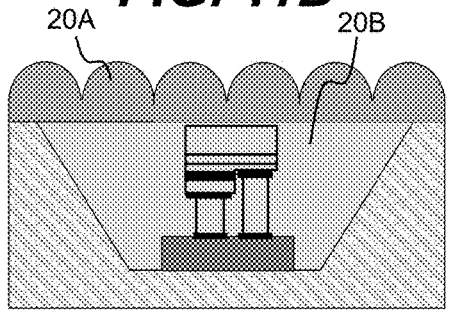
Figure 11E:
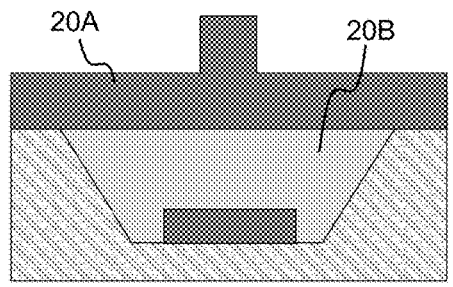

The transparent polymer encapsulating material described herein can have an outer surface having any of various shapes and/or patterns. For example, FIGS. 11A-11E show illustrative patterned transparent polymer films according to embodiments. In FIG. 11A, device packages 12A-12C are shown including transparent polymer films 20A-20C having outer surfaces with spherical bumps. In an embodiment, the device packages 12A-12C can be separated from one another at a valley between two adjacent bumps on the outer surface of the transparent polymer films 20A-20C. Furthermore, as shown in FIG. 11B, a device package can be circular, in which case the bumps on a transparent polymer film 20 can form a Fresnel lens pattern. In FIG. 11C, a transparent polymer film 20 is shown including an array of pyramid-like shapes (e.g., truncated pyramids), which can be arranged in an array. It is understood that various other patterns can be utilized, including patterns having features of multiple distinct scales. For example, a pattern can have a first set of features of a first scale that is larger than the wavelength of the electromagnetic radiation emitted by the optoelectronic device, and a second set of features of a second scale that is smaller or on the order of magnitude as the wavelength of the electromagnetic radiation. Still further, it is understood that an encapsulant formed from particles can include any similar pattern described herein. Alternatively, as shown in FIGS. 11D and 11E, a patterned film 20A can be applied over a top of an encapsulant 20B, both of which can be formed from the same or different transparent materials. In either case, optical elements, such as waveguides can be directly formed from a fluoropolymer film. It is understood that these patterns are only illustrative of numerous patterns that can be formed. To this extent, embodiments can include any combination of one or more of: Fresnel lenses; conventional lenses; optical waveguides; optical splitters; attenuators; photonic crystals; delay lines; and/or the like, fabricated of a polymer described herein.

Figure 12:
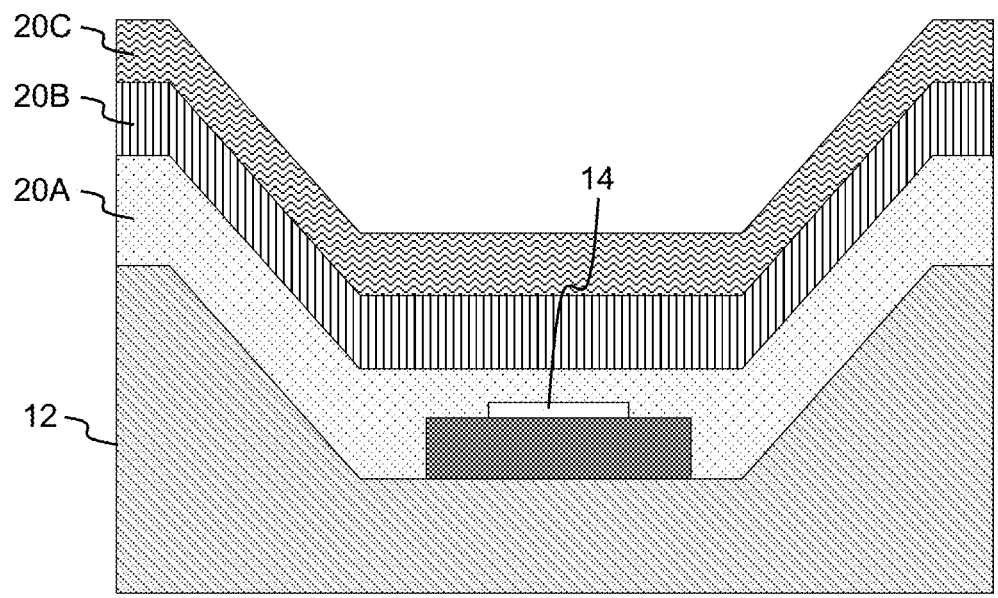
FIG. 12 shows an illustrative device package on which a plurality of transparent polymer films have been applied according to an embodiment.

Embodiments of a device package described herein can include multiple layers of transparent materials. To this extent, any transparent polymer film described herein can be a multi-layer transparent polymer film. For example, FIG. 12 shows an illustrative device package 12 on which a plurality of transparent polymer films 20A-20C have been applied according to an embodiment. In this case, each transparent polymer film 20A-20C can be formed of a unique material, which can be selected based on one or more desired properties for the film 20A-20C. In an illustrative embodiment, a first film 20A can be formed of a material having high adhesive properties to the optoelectronic device 14 and/or device package 12, but which may not have a high ultraviolet transparency. The second film 20B can be formed of a highly ultraviolet transparent material, while the third film 20C can have mechanical and/or chemical properties best suited to withstand the environment and provide a quality sealant for the device 14. In a more specific embodiment, the second film 20B has a transparency at least five percent higher (at least ten percent in a still more specific embodiment) than the transparency of the first film 20A.

In a specific illustrative embodiment, the first film 20A can comprise EFEP; the second film 20B can comprise ETFE, PTFE, or the like; and the outer film 20C can be formed of a material with low adhesive qualities, which can result in environmental agents (such as dust particles) having low or no adhesion the surface of the encapsulant. The outer film 20C, in addition, can form a protective mechanically stable and hardened layer, being chemically inert. To this extent, the outer film 20C can be biologically inactive and water impenetrable. Illustrative materials for the outer film 20C can include Fluon® ETFE as well as Fluon® LM ETFE, and similar materials.

However, it is understood that the use of three films of these order and attributes is only illustrative of various combinations and features that can be included in a multi-layer structure including any number of two or more layers. To this extent, the functionality of a layer in a multilayered structure can vary. Illustrative features provided by a film/layer include use as: an adhesive to the optoelectronic device 14; a heat spreading layer; a heat conducting layer; an optical index matching layer; an insulating layer; a chip and wirebond protecting layer; a mechanical stabilizer for hot stamping or high temperature overmold process; and/or the like. In an embodiment, the material of each film 20A-20C is selected to increase an extraction efficiency of the optoelectronic device 14, e.g., by selecting materials for each film 20A-20C with optical index of refractions configured to improve extraction efficiency.

Figure 13:
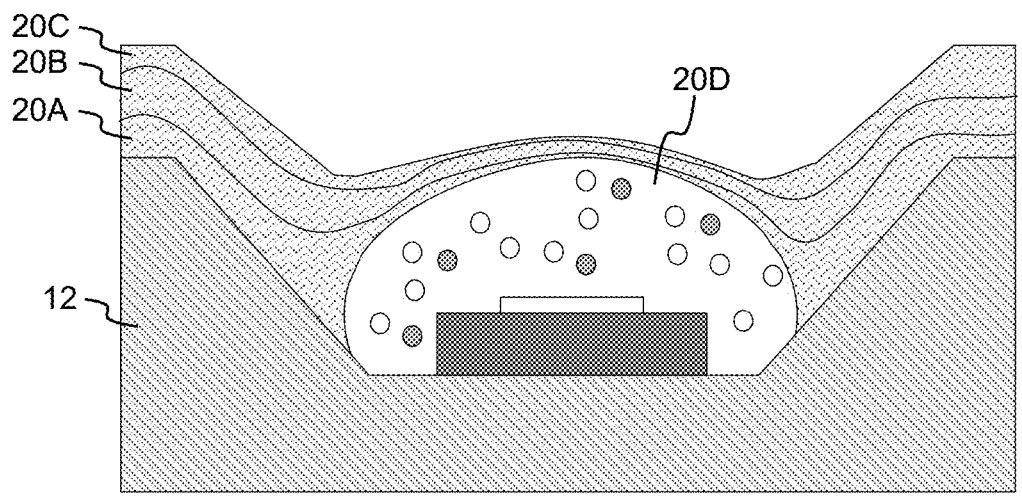
FIG. 13 shows an illustrative device package on which a plurality of films, at least one of which is a composite material, have been applied according to an embodiment.

In an embodiment, one or more of the layers can comprise a composite material as described herein. To this extent, FIG. 13 shows an illustrative device package 12 on which a plurality of films 20A-20D, at least one of which is a composite material, have been applied. For example, the film 20D can be applied as described herein, followed by application of the films 20A-20C, each of which can be formed of a similar or different material as described herein. The film 20D can be a composite material formed of multiple materials. Furthermore, as illustrated, the film 20D can be shaped as a lens, which is subsequently covered by one or more films 20A-20C. The different materials in the film 20D can create volumetric domains (indicated by circular regions) within the film 20D having one or more unique properties from the remainder of the film 20D. As used herein, a domain is a region of material that only partially extends over the device package. For example, the volumetric domains can have a different (e.g., significantly higher or significantly lower) ultraviolet transparency than the remainder of the film 20D. Such domains can be formed of any material including, for example, ultraviolet transparent polymers, fused silica, sapphire, and/or the like. Furthermore, a domain can itself be a composite material, e.g., with micro- and/or nano-particles embedded therein. In an embodiment, a domain (such as particles embedded in the film 20D) is formed of a material that visibly fluoresces under exposure to ultraviolet radiation generated by an optoelectronic device (e.g., a luminophore). In another embodiment, a domain can be diffusively reflective. For example, a diffusively reflective domain can be formed of a highly ultraviolet reflective expanded polytetrafluoroethylene (ePTFE) membrane (e.g., GORE® Diffuse Reflector Material), and/or the like.

Figure 14:
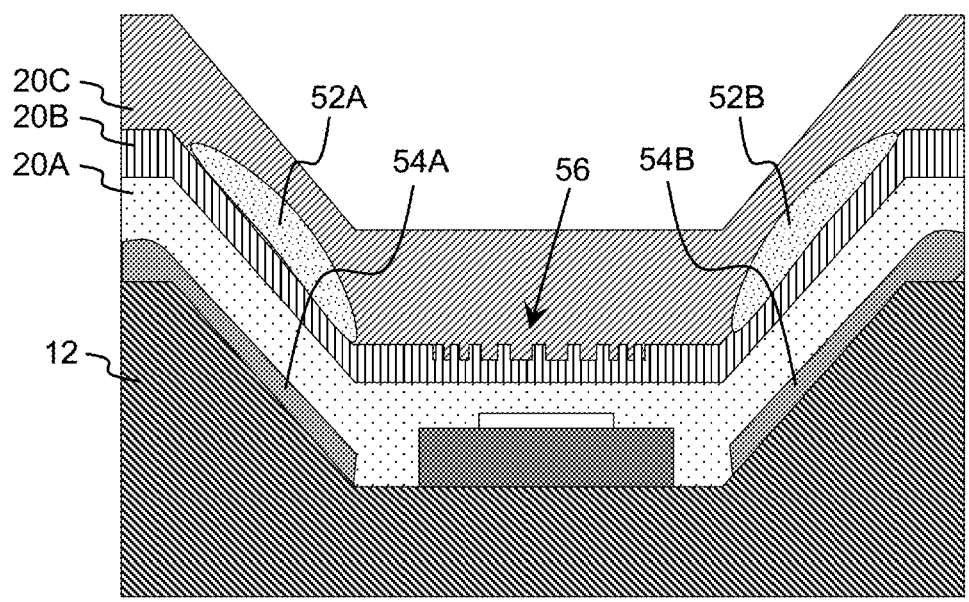
FIG. 14 shows an illustrative device package including several different domains formed thereon according to an embodiment.
Figure 15:
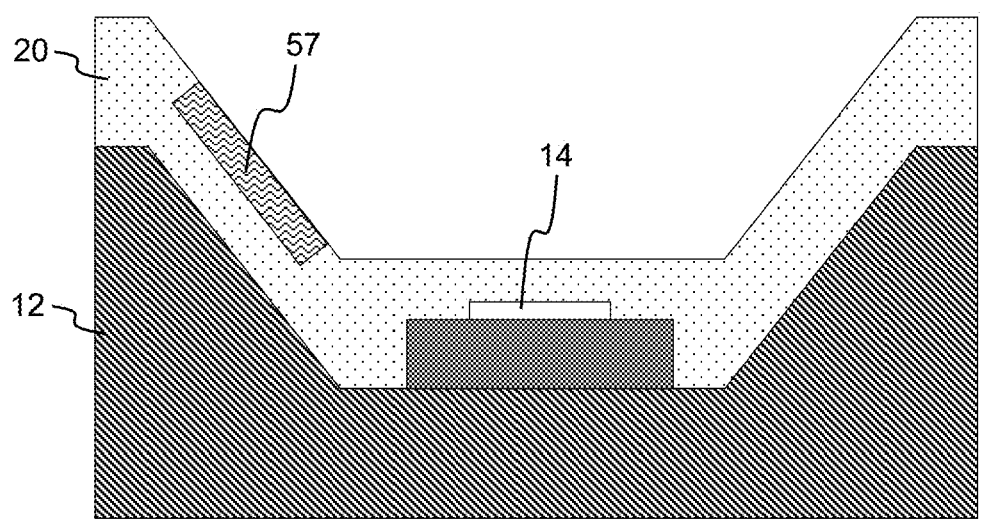
FIG. 15 shows an illustrative device package including a domain formed within a transparent polymer film according to an embodiment.

In an embodiment, larger scale domains and/or domains formed using alternative approaches are included within the encapsulating materials. For example, FIG. 14 shows an illustrative device package 12 including several different domains formed thereon according to an embodiment. In this case, the domains can include: domains 52A, 52B, which can be formed of a transparent material having diffusive properties; domains 54A, 54B, which can be formed of a material having a spectral or diffusive reflectance; and domain 56, which can be formed by a patterned structure at the interface between the layers 20B, 20C (e.g., which can be formed by patterning or roughening the surface of layer 20B using any solution prior to applying layer 20C). FIG. 15 shows an illustrative device package including a domain 57 formed within a transparent polymer film 20 according to an embodiment. The domain 57 can be formed of a material that fluoresces in ultraviolet light. In this case, the domain 57 can provide a fluorescent indicator, providing a visible light indicator when the device 14 is operating. In this case, the domain 57 can be a phosphor, for example, a rare earth oxide, or similar phosphors (e.g., $Ca_5(F,Cl)(PO_4)_3$:Sb,Mn) such as those used in fluorescent lamps. While layer 20B is shown having a patterned structure, it is understood that any combination of one or more layers 20A-20C can include patterning or roughening, which can be configured to provide any desired attribute. To this extent, a layer 20A-20C can include large and small scale roughness, in which the large scale roughness is substantially larger than the target wavelength of the device measured within the film, and the small scale roughness is comparable to (e.g., on the order of) the target wavelength of the device measured within the film.

It is understood that a device package can include any combination of domains, each of which can be included for any purpose. For example, domains, such as the domains shown in FIGS. 13 and 14, can be included to improve the light extraction from the structure. Additionally, domains can be included to manipulate the light, e.g., by directional distribution of the intensity of the light to produce a target angular distribution of light intensity. Similarly, a multilayered film structure for the encapsulating material can be utilized to improve light extraction and/or manipulate the light. For example, a multilayered film structure can be configured to reduce reflectance from the film/air boundary. A more specific embodiment can include films with graded index of refraction, which can be fabricated by properly merging films of different polymers, by introducing appropriate roughness at the film air interface, and/or the like.

Figure 16:
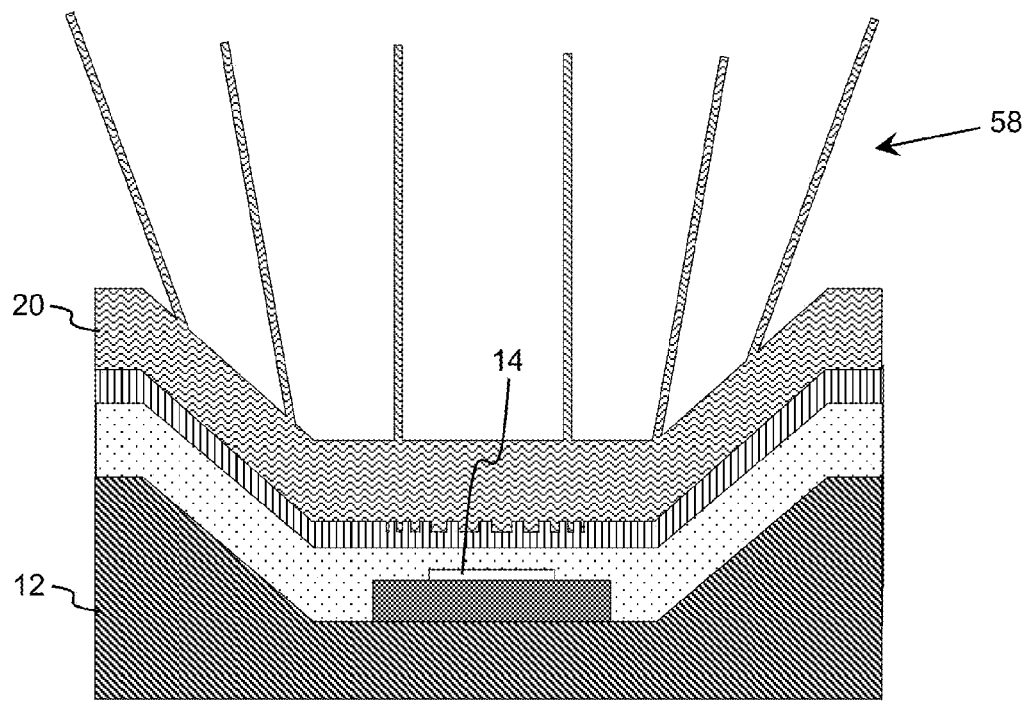
FIG. 16 shows a transparent polymer film including a plurality of protrusions according to an embodiment.

In addition to component protection and light extraction/manipulation, a transparent polymer material described herein can be configured to provide one or more additional features. For example, FIG. 16 illustrates a transparent polymer film 20 including a plurality of protrusions 58, which can be engineered to promote convective cooling thereby dissipating heat generated during operation of the optoelectronic device 14. The protrusions 58 can be fabricated using any solution, such as through the use of stamping or the like.

Figure 17A:
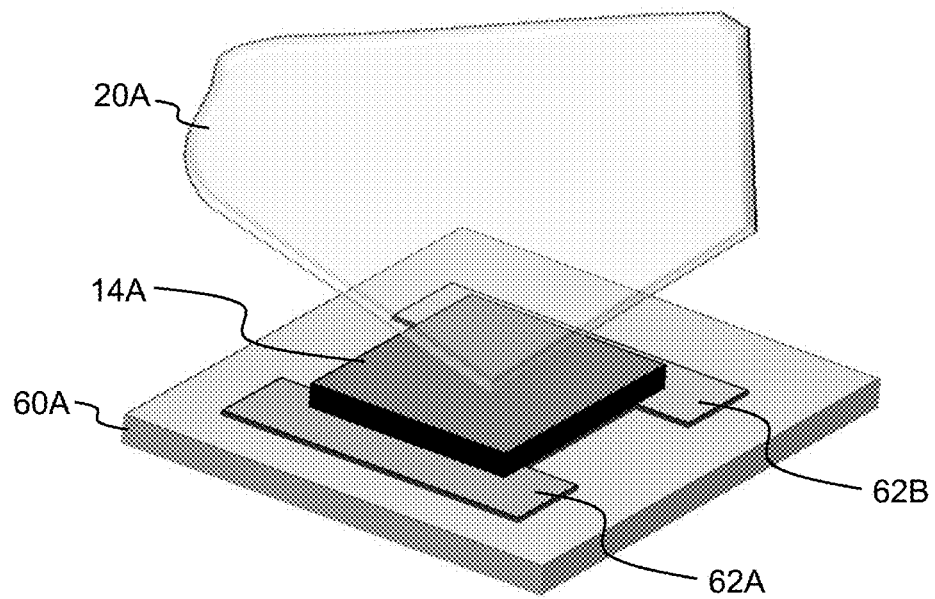
FIGS. 17A and 17B show optoelectronic devices mounted directly onto printed circuit boards according to embodiments.
Figure 17B:
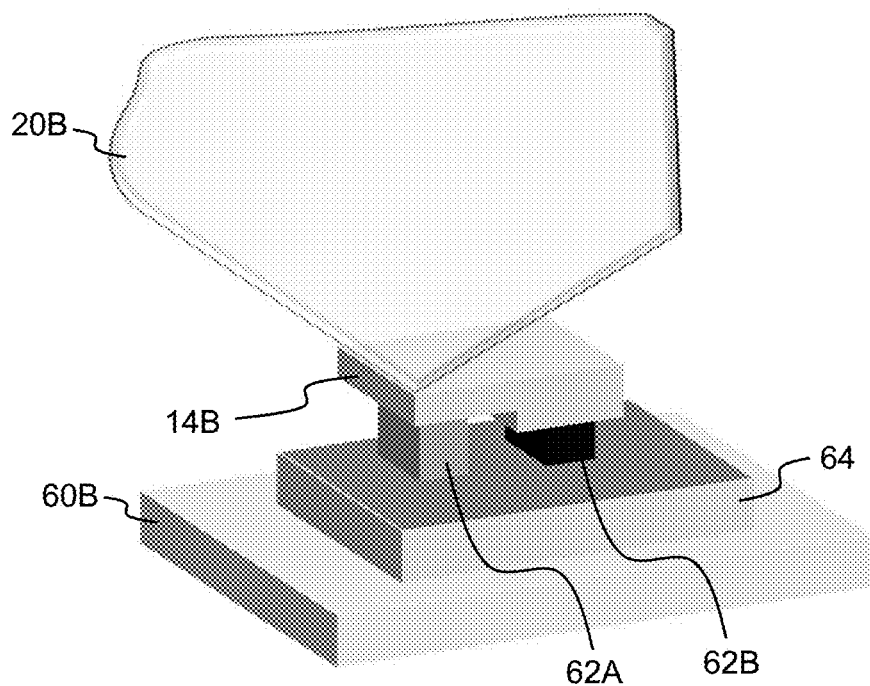

While various embodiments shown and described herein are directed to an optoelectronic device 14 surface mounted on a surface of a depression in a device package 12, it is understood that embodiments can be directed to encapsulating optoelectronic devices 14 mounted in other configurations. For example, FIGS. 17A and 17B show optoelectronic devices 14A, 14B mounted directly onto printed circuit boards (PCBs) 60A, 60B according to embodiments. Each device 14A, 14B is mounted (e.g., soldered) to the PCB 60A, 60B via contact pads 62A, 62B. A submount 64 also is used in mounting the device 14B to the printed circuit board 60B. In either case, a transparent polymer film 20A, 20B can cover the entire assembly (e.g., the device, contact pads, and submount), and subsequently processed using a solution described herein in order to encapsulate the device 14A, 14B, contact pads, 62A, 62, and/or submount 64. For example, the transparent polymer film 20A, 20B can be heated (e.g., within a heating chamber) such that it becomes flowable.

Figure 18A:
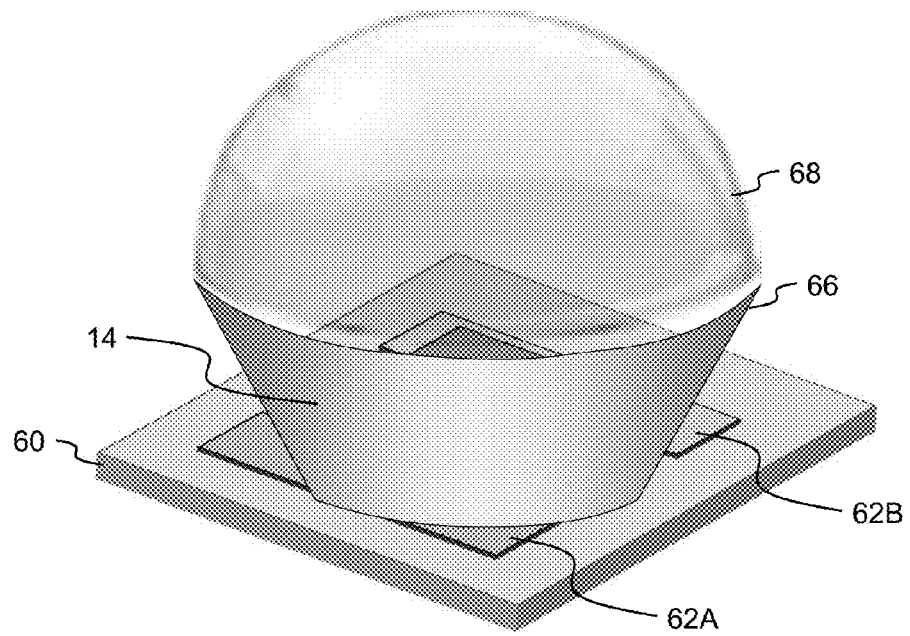
FIGS. 18A-18C show an optoelectronic device mounted directly onto a printed circuit board according to another illustrative embodiment.
Figure 18B:
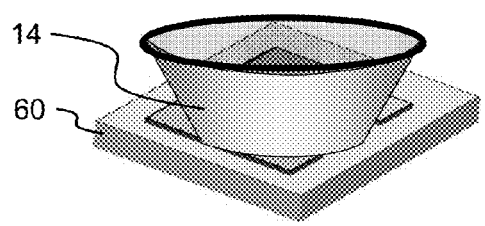
Figure 18C:
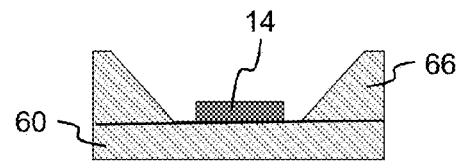

Package assemblies directly on printed circuit boards 60A, 60B also can include various features. To this extent, FIGS. 18A-18C show an optoelectronic device 14 mounted directly onto a printed circuit board 60 according to another illustrative embodiment. As shown in FIG. 18A, a reflector 66 and a lens 68 can be mounted over the optoelectronic device 14. Alternatively, as shown in FIG. 18B, only a reflector 66 can be mounted over the optoelectronic device 14. Regardless, the reflector 66 can be formed of any type of highly reflective material, such as highly polished aluminum, which can reflect approximately seventy percent of the radiation. As illustrated, the reflector 66 can comprise a conical reflector with the smaller diameter mounted directly adjacent to the device 14 on the board 60 such that the light emitted by the device 14 travels through the reflector 66. Use of the reflector 66 can later an angular distribution of the light emitted by the device 14. The lens 68 can be formed of any suitable ultraviolet transparent material, such as sapphire, fused silica, a fluoropolymer, and/or the like. The lens 68 can be positioned over the reflector 66 or contained within a portion of the reflector 66.

As shown in FIG. 18C, a combination of the reflector 66 and the printed circuit board 60 can provide a similar cross section with respect to the device 14 as the device packaging described herein. To this extent, it is understood that the various embodiments and alternatives and their corresponding features described herein in conjunction with the device package embodiments apply equally to the printed circuit board 60 and reflector 66 embodiments. The reflector 66 can be attached to the printed circuit board 60 using a transparent polymer material and a process described herein with respect to other components. Similarly, the lens 68 can be attached to the reflector 66 using a transparent polymer material and a process described herein. The device 14 can be either wire bonded (e.g., contact leads soldered to the terminals of the device 14) or directly soldered to contacts of the board 60. Regardless, a transparent polymer material can encapsulate the device 14 as described herein.

Figure 19A:
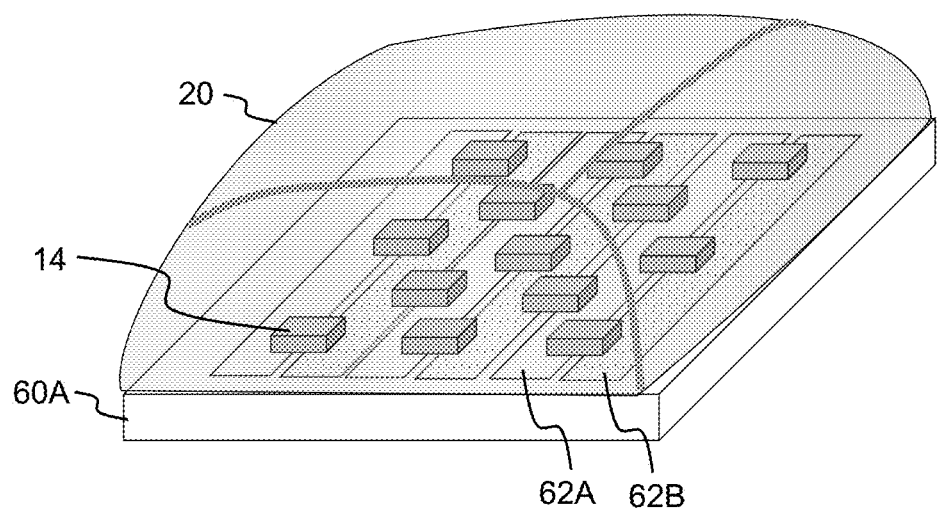
FIGS. 19A and 19B show optoelectronic devices mounted to printed circuit boards according to other illustrative embodiments.
Figure 19B:
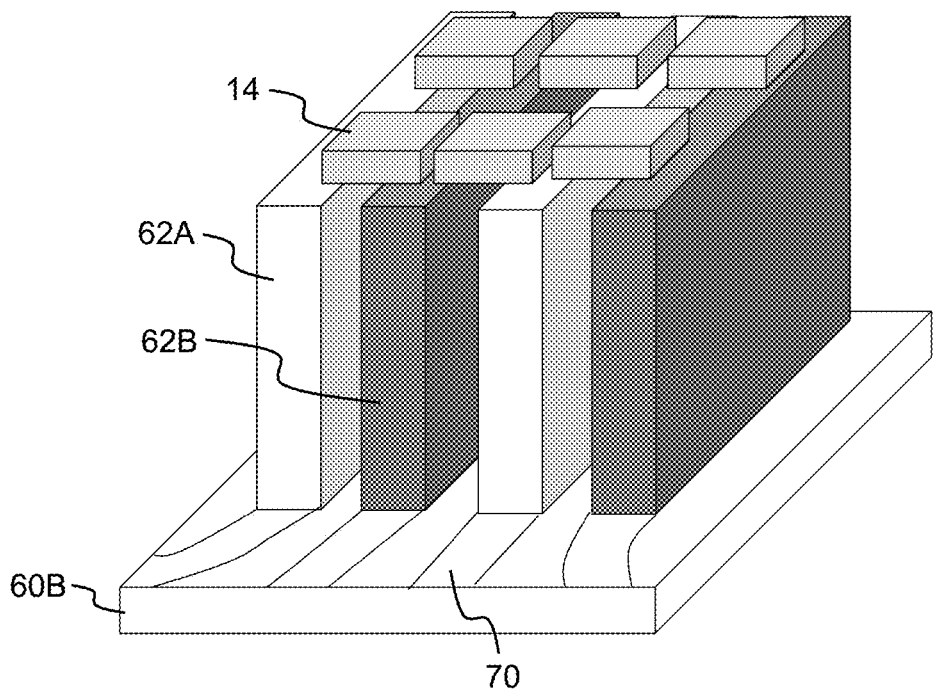

Embodiments can include multiple devices encapsulated within a single layer of transparent material, no reflective side surfaces, and/or the like. To this extent, FIGS. 19A and 19B show optoelectronic devices 14 mounted to printed circuit boards 60A, 60B according to other illustrative embodiments. In each case, multiple devices 14 are arranged in a two dimensional pattern and are attached to the printed circuit board 60A, 60B via contacts 62A, 62B. In FIG. 19B, the contacts 62A, 62B form fins. The devices 14 can be direct flip-chip die attached to the printed circuit board 60A, 60B using any solution. The printed circuit board 60A, 60B can comprise, for example, a metal core printed circuit board. As shown in FIG. 19A, encapsulation of the devices 14 by a transparent polymer film 20 can seal the devices 14 from the environment. It is understood that a similarly configured transparent polymer film 20 can encapsulate the devices 14 shown in FIG. 19B. Such a solution can provide a dual purpose of protecting the devices 14 from the environment and for improving light extraction efficiency from the devices 14.

An embodiment of a chip assembly and fabrication process can provide for efficient heat management, as it can reduce (minimize) interfaces between the device 14 die and the ambient, e.g., by eliminating an intermediate carrier or submount and wire bonding through direct die attachment to the printed circuit board 60A, 60B. In particular, each device 14 die can be soldered to the contacts 62A, 62B such as to create a forward bias within the device 14 under an applied voltage. In an embodiment, the printed circuit board 60A, 60B is fabricated from a material having a similar thermal expansion as that of the device 14 die. To this extent, such a material can be selected by selecting a corresponding metallic alloy, selecting a material having a high thermal conductivity and a similar thermal expansion, and/or the like. Illustrative materials include ceramics, such as AlN, ceramic alumina, metal core PCB, metal core ceramic PCB, single crystal SiC, single crystal AlN, other materials or stacks of material having a low total thermal resistance between the device junction and substrate solder point, and/or the like. As used herein, a low thermal resistance can correspond to a thermal resistance in the range of 10-5°

C./W or less. In an embodiment, the printed circuit board 60A, 60B can be a flexible material, such as a thin layer of stainless steel.

Regardless, it is understood that the space between contacts 62A, 62B can include a thin layer of a dielectric film and/or a gap to prevent shorting of the devices 14. For the embodiment shown in FIG. 19B, the printed circuit board 60B can be formed of a highly thermally conductive insulator, such as silicon carbide, AlN, diamond, and/or the like. In this case, electrical connection can be provided by contact pads 70. The present approach of device assembly can support roll-to-roll manufacturing production using a roll of a flexible substrate, assembly of the devices on a moving substrate, and separation of the flexible substrate into preassembled modules. Furthermore, an embodiment can provide packaging for a circuit or module including multiple optoelectronic devices, which can be connected and/or can communicate by electrical (e.g., wired), optical (waveguides, optical communications including visible, ultraviolet terahertz, infrared, and/or the like), and/or electromagnetic (e.g., wireless, such as microwave and radio communications) solutions.

While illustrative aspects of the invention have been shown and described herein primarily in conjunction with a device package for an optoelectronic device and a method of fabricating such a device package, it is understood that aspects of the invention further provide various alternative embodiments.

Figure 20:
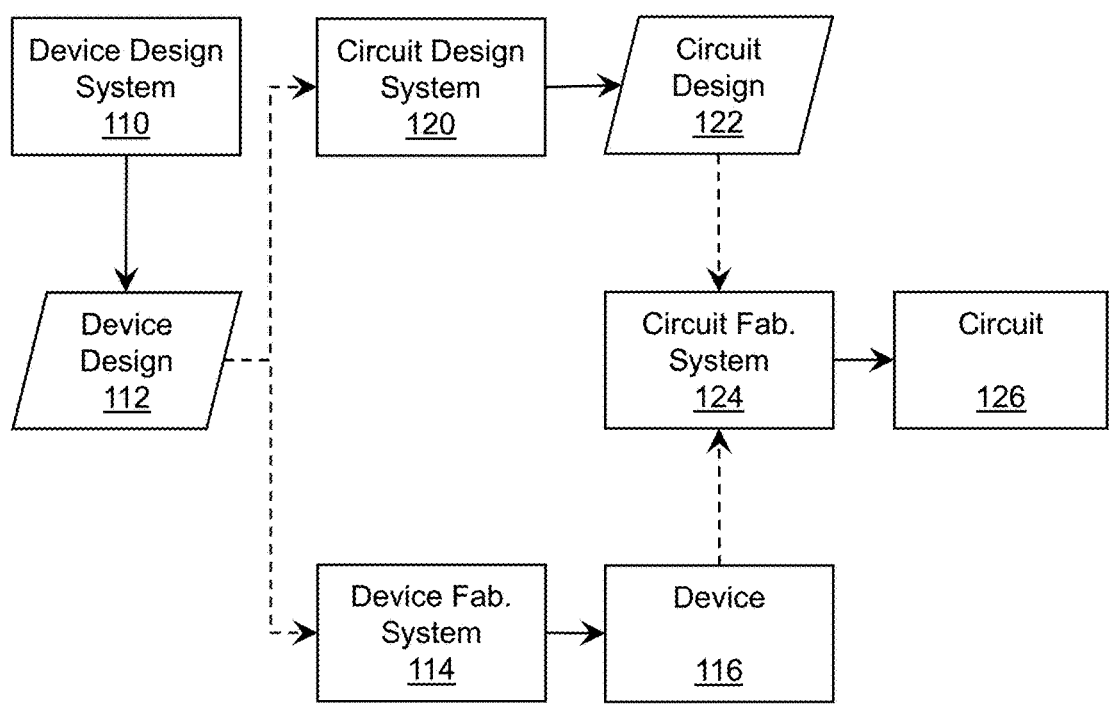
FIG. 20 shows an illustrative flow diagram for fabricating a circuit according to an embodiment.

In one embodiment, the invention provides a method of designing and/or fabricating a circuit that includes one or more of the packaged devices designed and fabricated as described herein. To this extent, FIG. 20 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112.

To this extent, the device fabrication system 114 can include a temperature and/or pressure chamber, which can be utilized to facilitate adhesion between the transparent polymer material and the device and/or the device package as described herein. Furthermore, the device fabrication system 114 can include a stamp tool, which can be operated to apply pressure between the transparent polymer material and the device and/or device package. Still further, the device fabrication system 114 can include other components, such as a local heat source (e.g., a laser), a local vacuum source, a cutting tool, a light source, a chemical source, and/or the like, each of which can be operated to perform one or more actions described herein.

The device fabrication system 114 can include a computer system, which is programmed to automatically or semi-automatically operate the various components in order to perform a device packaging process described herein. It is understood that various alterations can be made to a general device packaging process, e.g., based on the materials being utilized. For example, certain polymers may require an optimal heating and cooling schedule, which can be a complex function of time and space. For spatial-temporal resolution, the device fabrication system 114 can include a heating laser operated by the programmed computer system. In another embodiment, the computer system of the device fabrication system 114 can operate the heating in a pulsed mode, which can vary in time when a stack of films is applied to package the device. Regardless, the computer system can optimally correlate the heating with the process of application of vacuum for a process utilizing a vacuum chamber as described herein.

Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of packaging a set of optoelectronic devices, the method comprising:
    obtaining a device package including the set of optoelectronic devices mounted on a first surface, wherein each optoelectronic device in the set of optoelectronic devices is located within a set of cavities of the device package;
    placing an ultraviolet transparent polymer film adjacent to each optoelectronic device in the set of optoelectronic devices on the first surface; and
    processing, without melting, the ultraviolet transparent polymer film to cause the ultraviolet transparent polymer film to collapse and adhere to at least a portion of the first surface such that the device package and the ultraviolet transparent polymer film seal a portion of each optoelectronic device in the set of optoelectronic devices located on the first surface from an ambient environment, wherein the processing includes creating a pressure difference between a top surface of the ultraviolet transparent polymer film and the set of cavities sufficient to cause the ultraviolet transparent polymer film to collapse onto each optoelectronic device in the set of optoelectronic devices.

2. The method of claim 1, wherein the set of optoelectronic devices includes a plurality of optoelectronic devices, and wherein the method further includes physically separating the device package between at least some of the plurality of optoelectronic devices, wherein the portion of each optoelectronic device in the set of optoelectronic devices remains sealed from the ambient environment after the separating.

3. The method of claim 1, wherein the set of optoelectronic devices includes a plurality of optoelectronic devices, and wherein the processing seals at least two of the plurality of optoelectronic devices within a single sealed area.

4. The method of claim 1, wherein the processing includes at least one of: applying a pressure to the film and the device package or heating the film at least at a location of the film contacting the device package.

5. The method of claim 1, wherein the processing includes heating the device package and the ultraviolet transparent polymer film to a first temperature below a melting point of the ultraviolet transparent polymer film.

6. The method of claim 5, wherein the processing further includes:
    maintaining the first temperature for a first period of time; and
    applying a pressure to the ultraviolet transparent polymer film and the device package after the first period of time.

7. The method of claim 6, wherein the processing further includes:
    increasing the temperature after the first period of time to a second temperature higher than the first temperature, wherein the second temperature is below the melting point of the ultraviolet transparent polymer film; and
    maintaining the temperature at the second temperature for a second period of time after the increasing, wherein the pressure is applied after the second period of time has started.

8. The method of claim 7, wherein the increasing includes gradually raising the temperature no faster than one degree per minute.

9. The method of claim 1, wherein the processing includes applying a pressure to at least a portion of the ultraviolet transparent polymer film with a stamp tool.

10. The method of claim 9, wherein the method further comprises applying an adhesive material to at least one of: the ultraviolet transparent polymer film or the device package, in areas at which the ultraviolet transparent polymer film will directly contact the device package prior to the processing.

11. The method of claim 1, wherein the ultraviolet transparent polymer film includes a plurality of particles of an ultraviolet transparent polymer material.

12. The method of claim 1, wherein each optoelectronic device in the set of optoelectronic devices is located within a unique cavity in the set of cavities of the device package, and wherein each cavity in the device package that contains an optoelectronic device includes a set of openings located about a periphery of the optoelectronic device configured to allow air to escape from the cavity when a top surface of the cavity is covered with the ultraviolet transparent polymer film.

13. The method of claim 12, wherein the processing includes removing air from the set of openings in each cavity using a vacuum chamber.

14. The method of claim 1, further comprising attaching at least one optoelectronic device in the set of optoelectronic devices to a structure using the ultraviolet transparent polymer film.

15. The method of claim 1, wherein the placing and processing are repeated for at least one additional ultraviolet transparent polymer film.

16. The method of claim 15, wherein the ultraviolet transparent polymer film is an adhesive film and the at least one additional ultraviolet transparent polymer film is an environmentally protective film.

17. A method of packaging an optoelectronic device, the method comprising:
    mounting the optoelectronic device onto a first surface of a device package;
    placing an ultraviolet transparent polymer film adjacent to the optoelectronic device on the first surface; and
    processing the ultraviolet transparent polymer film to cause the ultraviolet transparent polymer film to adhere to at least a portion of the first surface and at least a portion of the optoelectronic device such that the device package and the ultraviolet transparent polymer film seal a portion of the optoelectronic device from an ambient environment, wherein the processing includes:
    heating the ultraviolet transparent polymer film to a first temperature that causes the ultraviolet transparent polymer film to experience a phase change and a change of transparent properties;

maintaining the heating at the first temperature until the ultraviolet transparent polymer film is at least twenty percent more transparent to visible and/or ultraviolet radiation than prior to the phase change; and heating the ultraviolet transparent polymer film to a second temperature to adhere the ultraviolet transparent polymer film to the first surface of the device package and at least a portion of the optoelectronic device after the ultraviolet transparent polymer film is at least twenty percent more transparent to visible and/or ultraviolet radiation.

18. The method of claim 17, wherein the processing includes:

heating the device package and the film to cause the film to become flowable;

monitoring the film to determine when the film has flowed sufficiently; and allowing the film to cure after sufficient flow has occurred.

19. A method of packaging an optoelectronic device, the method comprising:

placing an ultraviolet transparent polymer film adjacent to a first surface of a device package on which an optoelectronic device is mounted, wherein the device package includes a cavity containing the optoelectronic device and a set of openings formed in the cavity located about a periphery of the optoelectronic device; and processing the ultraviolet transparent polymer film to cause the ultraviolet transparent polymer film to adhere to at least a portion of the first surface and at least a portion of the optoelectronic device such that the device package and the ultraviolet transparent polymer film seal a portion of the optoelectronic device from an ambient environment, wherein the processing includes:

heating the ultraviolet transparent polymer film to cause the film to become flowable;

monitoring the ultraviolet transparent polymer film to determine when the film has flowed sufficiently;

applying a pressure to the ultraviolet transparent polymer film and the device package after sufficient flow has occurred;

expunging air from the set of openings of the device package as the pressure is applied and the ultraviolet transparent polymer film adheres to at least the portion of the first surface of the device package and at least a portion of the optoelectronic device; and allowing the ultraviolet transparent polymer film to cure.

20. The method of claim 19, wherein the ultraviolet transparent polymer film is a copolymer of ethylene, tetrafluoroethylene, and hexafluoropropylene.

* * * * *